United States Patent
Kasai

(10) Patent No.: US 6,348,408 B1
(45) Date of Patent: Feb. 19, 2002

(54) SEMICONDUCTOR DEVICE WITH REDUCED NUMBER OF INTERMEDIATE LEVEL INTERCONNECTION PATTERN AND METHOD OF FORMING THE SAME

(75) Inventor: Naoki Kasai, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/703,867

(22) Filed: Nov. 2, 2000

(30) Foreign Application Priority Data

Nov. 4, 1999 (JP) ............................................. 11-314462

(51) Int. Cl.[7] ........................................... H01L 21/4763
(52) U.S. Cl. ....................... 438/638; 438/637; 438/622; 438/672
(58) Field of Search ................................ 438/618, 622, 438/631, 637, 638, 672, 675

(56) References Cited

U.S. PATENT DOCUMENTS

| | | | |
|---|---|---|---|
| 5,604,156 A | * 2/1997 | Chung et al. ............... | 438/620 |
| 5,926,732 A | * 7/1999 | Matsuura .................... | 438/622 |
| 5,994,218 A | * 11/1999 | Sugimoto et al. ........... | 438/660 |
| 6,077,771 A | * 6/2000 | Liao ........................... | 438/627 |
| 6,100,177 A | * 8/2000 | Noguchi ..................... | 438/620 |
| 6,177,342 B1 | * 1/2001 | Lee et al. ................... | 438/638 |
| 6,180,516 B1 | * 1/2001 | Hsu ............................ | 438/638 |
| 6,191,027 B1 | * 2/2001 | Omura ....................... | 438/627 |
| 6,211,061 B1 | * 4/2001 | Chen et al. ................. | 438/622 |
| 6,245,662 B1 | * 6/2001 | Naik et al. .................. | 438/622 |
| 6,281,121 B1 | * 8/2001 | Brown et al. ............... | 438/633 |

* cited by examiner

Primary Examiner—Kevin M. Picardat
(74) Attorney, Agent, or Firm—Young & Thompson

(57) ABSTRACT

The present invention also provides a multilevel interconnection structure comprising: at least a set of a first lower level contact plug extending in a lower level inter-layer insulator structure and a first higher level contact plug extending in a higher level inter-layer insulator structure extending over the lower level inter-layer insulator structure, wherein a top of the first lower level contact plug is contact directly with a bottom of the first higher level contact plug without intervening any interconnection pad; a stopper insulating film extending between the lower level inter-layer insulator structure and the higher level inter-layer insulator structure; and at least a lower-level single conductive united structure which further comprises: a second lower level contact plug extending in the lower level inter-layer insulator structure; and a first lower level interconnection extending in a lower-level interconnection groove formed in an upper region of the lower level inter-layer insulator structure, wherein a top surface of the first lower level interconnection is leveled to a top surface of the lower level inter-layer insulator structure and also leveled to the top of the first lower level contact plug.

27 Claims, 22 Drawing Sheets

SEMICONDUCTOR DEVICE WITH REDUCED NUMBER OF INTERMEDIATE LEVEL INTERCONNECTION PATTERN AND METHOD OF FORMING THE SAME

BACKGROUND OF THE INVENTION

The present invention relates to a semiconductor device and a method of forming the same, and more particularly to a semiconductor device with a reduced number of intermediate level interconnection patterns and a method of forming the same with a reduced number of processes.

The number of semiconductor devices integrated on a semiconductor integrated circuit chip has been on the increase of about four times per three years. An advanced semiconductor memory device has an integration of more than one hundred million of the semiconductor devices. Such the ultra large scale integrated circuit having the integration of a large number of the semiconductor devices also has a large number of interconnections which interconnect the semiconductor devices. The ultra large scale integrated circuit has a multilevel interconnection structure, wherein the number of levels of the interconnection layers has been on the increase, for example, up to not less than five levels. In order to increase the density of integration of the large scale integrated circuits, it is necessary to form fine interconnections inter-connecting the individual semiconductor devices and fine contacts connecting the different level interconnections. In addition, it is essential that the multilevel interconnection structure is suitable for increasing the degree of the integration and is formed by an appropriate fabrication method. Usually, the integrated circuit having the multilevel interconnection structure may be fabricated as follows. A first level inter-layer insulator is formed on a semiconductor substrate having semiconductor devices. First level contact holes are formed in the first level inter-layer insulator, so that the first level contact holes reach the semiconductor devices. Conductive layers are filled into the first level contact holes so that first level contact plugs reaching the semiconductor devices are formed in the first level contact holes. First level interconnection layers are formed which extend over the top surface of the first level inter-layer insulator, so that the first level interconnection layers are in contact with top portions of the first level contact plugs in the first level contact holes, whereby the first level interconnection layers are connected through the first level contact plugs to the semiconductor devices on the top surface of the semiconductor substrate. As a result, a first level interconnection structure is completed. In order to form the multilevel interconnection structure, it is necessary to form second, third and further level interconnection structures over the first level interconnection structure in the same manners as described above. Namely, a second level inter-layer insulator is formed on the first level interconnection layers and the first level inter-layer insulator. Second level contact holes are formed in the second level inter-layer insulator, so that the second level contact holes reach the first level interconnection layers. Conductive layers are filled into the second level contact holes so that second level contact plugs reaching the first level interconnection layers are formed in the second level contact holes. Second level interconnection layers are formed which extend over the top surface of the second level inter-layer insulator, so that the second level interconnection layers are in contact with top portions of the second level contact plugs in the second level contact holes, whereby the second level interconnection layers are connected through the second level contact plugs to the first level interconnection layers. As a result, a second level interconnection structure is completed. Further, a third level inter-layer insulator is formed on the second level interconnection layers and the second level inter-layer insulator. Third level contact holes are formed in the third level inter-layer insulator, so that the third level contact holes reach the second level interconnection layers. Conductive layers are filled into the third level contact holes so that third level contact plugs reaching the second level interconnection layers are formed in the third level contact holes. Third level interconnection layers are formed which extend over the top surface of the third level inter-layer insulator, so that the third level interconnection layers are in contact with top portions of the third level contact plugs in the third level contact holes, whereby the third level interconnection layers are connected through the third level contact plugs to the second level interconnection layers. As a result, a third level interconnection structure is completed. Similarly, fourth, fifth and higher level interconnection structures are formed in the same manners. Electrodes are formed on a top inter-layer insulator, so that the electrodes are in contact with the top contact plugs formed in the top contact holes formed in the top inter-layer insulator, whereby the electrodes are connected through the top contact plugs to the top interconnection layers.

In accordance with the above described first conventional multilevel interconnection structure, the semiconductor devices are connected through all of the multilevel interconnection structures to the electrodes. Namely, the semiconductor devices are connected through all levels of the interconnection layers and the contact plugs to the electrodes, independently from the issue of whether or not it is necessary that the semiconductor devices are connected to any of the intermediate level interconnection layers other than the top level interconnection structures. This means that at least some of the intermediate level interconnection layers are formed for the propose only of indirectly contributing to connect the semiconductor devices on the semiconductor substrate to the electrodes on the top inter-layer insulator, whereby the number of the intermediate level interconnection layers is increased and thereby making it difficult to further increase the density of integration of the integrated circuit having the multilevel interconnection structure.

In order to solve the above problems, a second conventional multilevel interconnection structure was proposed, wherein multilevel contact plugs are connected with each other without intervening the intermediate level interconnection layers. This second conventional multilevel interconnection structure is disclosed in Japanese laid-open patent publication No. 62-130542.

FIG. 1 is a fragmentary cross sectional elevation view illustrative of the second conventional multilevel interconnection structure of the integrated circuit. A first level interconnection layer 101 is formed which extends on a top surface of a silicon substrate 100. A first level inter-layer insulator 102 made of phospho-silicate-glass is entirely formed over the first level interconnection layer 101 and the silicon substrate 100, so that the first level inter-layer insulator 102 covers the first level interconnection layer 101. First level through holes are formed in the first level inter-layer insulator 102, so that the first level through holes reach the first level interconnection layer 101. A conductive metal is filled into the first level through holes to form first level metal contact plugs 103 in the first level through holes in the first level inter-layer insulator 102, so that the first level metal contact plugs 103 are in contact with the first level interconnection layer 101. A second level interconnection layer 105 is formed which extends on a top surface of the first level inter-layer insulator 102, so that the second level interconnection layer 105 is in contact with the tops of some of the first level metal contact plugs 103. A second level inter-layer insulator 104 made of phospho-silicate-glass is entirely formed over the second level interconnection layer 105 and the top surface of the first level inter-layer insulator 102, so that the second level inter-layer insulator 104 covers the second level interconnection layer 105. Second level through holes are formed in the second level inter-layer insulator 104, so that some of the second level through holes reach the second level interconnection layer 105, whilst the remaining ones of the second level through holes are aligned to or reach the tops of the first level metal contact plugs 103 in the first level through holes in the first level inter-layer insulator 102. A conductive metal is filled into the first level through holes to form second level metal contact plugs 106 in the second level through holes in the second level inter-layer insulator 104, so that some of the second level metal contact plugs 106 are in contact with the second level interconnection layer 105, whilst the remaining ones of the second level metal contact plugs 106 are in contact with the tops of the first level metal contact plugs 103 in the first level through holes in the first level inter-layer insulator 102. A third level interconnection layer 107 is formed which extends on a top surface of the second level inter-layer insulator 104, so that the third level interconnection layer 107 is in contact with the second level metal contact plugs 106.

As shown in FIG. 1, some of the second level metal contact plugs 106 are connected through the second level interconnection layer 105 to the first level metal contact plugs 103, whilst the remaining of the second level metal contact plugs 106 are aligned to the remaining of the first level metal contact plugs 103. The remaining of the second level metal contact plugs 106 are directly connected to the remaining of the first level metal contact plugs 103 without intervening the second level interconnection layer 105, whereby it is possible to reduce the necessary number of the interconnection patterns of the second level interconnection layer 105. Namely, the second level interconnection layer 105 does not need to include any interconnection pattern which serves only as an interconnection pad connecting the first level metal contact plug 103 and the second level metal contact plug 106. This contributes to increase the density of the integration of the integrated circuit.

Further, the second level metal contact plug 106 and the second level interconnection layer 105 have the same bottom level as each other. The second level inter-layer insulator 104 has a non-planarized top surface because no planarization process is carried out to the second level inter-layer insulator 104. As a result, the second level inter-layer insulator 104 is uniform in thickness between over the second level interconnection layer 105 and over the first level metal contact plug 103, for which reason the second level through holes formed in the second level inter-layer insulator 104 have the uniform depth between over the second level interconnection layer 105 and over the first level metal contact plug 103. Steps of the second level inter-layer insulator 104 are formed over edges of the interconnection patterns of the second level interconnection layer 105. The second level inter-layer insulator 104 is, however, subjected to a heat treatment to make those steps into slopes. The top surface of the second level inter-layer insulator 104 is never planarized.

FIG. 2 is a fragmentary cross sectional elevation view illustrative of the third conventional multilevel interconnection structure of the integrated circuit. A first level interconnection layer 101 is formed which extends on a top surface of a silicon substrate 100. A first level inter-layer insulator 102 made of phospho-silicate-glass is entirely formed over the first level interconnection layer 101 and the silicon substrate 100, so that the first level inter-layer insulator 102 covers the first level interconnection layer 101. First level through holes are formed in the first level inter-layer insulator 102, so that the first level through holes reach the first level interconnection layer 101. A conductive metal is filled into the first level through holes to form first level metal contact plugs 103 in the first level through holes in the first level inter-layer insulator 102, so that the first level metal contact plugs 103 are in contact with the first level interconnection layer 101. A second level interconnection layer 105 is formed which extends on a top surface of the first level inter-layer insulator 102, so that the second level interconnection layer 105 is in contact with the tops of some of the first level metal contact plugs 103. A second level inter-layer insulator 104 made of phospho-silicate-glass is entirely formed over the second level interconnection layer 105 and the top surface of the first level inter-layer insulator 102, so that the second level inter-layer insulator 104 covers the second level interconnection layer 105. The second level inter-layer insulator 104 is then planarized to form a planarized top surface. The planarization is carried by a chemical mechanical polishing. Second level through holes are formed in the second level inter-layer insulator 104, so that some of the second level through holes reach the second level interconnection layer 105, whilst the remaining ones of the second level through holes are aligned to or reach the tops of the first level metal contact plugs 103 in the first level through holes in the first level inter-layer insulator 102. A conductive metal is filled into the first level through holes to form second level metal contact plugs 106 in the second level through holes in the second level inter-layer insulator 104, so that some of the second level metal contact plugs 106 are in contact with the second level interconnection layer 105, whilst the remaining ones of the second level metal contact plugs 106 are in contact with the tops of the first level metal contact plugs 103 in the first level through holes in the first level inter-layer insulator 102. A third level interconnection layer 107 is formed which extends on a top surface of the second level inter-layer insulator 104, so that the third level interconnection layer 107 is in contact with the second level metal contact plugs 106.

As shown in FIG. 2, some of the second level metal contact plugs 106 are connected through the second level interconnection layer 105 to the first level metal contact plugs 103, whilst the remaining of the second level metal contact plugs 106 are aligned to the remaining of the first level metal contact plugs 103. The remaining of the second level metal contact plugs 106 are directly connected to the remaining of the first level metal contact plugs 103 without intervening the second level interconnection layer 105, whereby it is possible to reduce the necessary number of the interconnection patterns of the second level interconnection layer 105. Namely, the second level interconnection layer 105 does not need to include any interconnection pattern which serves only as an interconnection pad connecting the first level metal contact plug 103 and the second level metal contact plug 106. This contributes to increase the density of the integration of the integrated circuit.

Further, the second level inter-layer insulator 104 has a planarized top surface. As a result, the second level inter-layer insulator 104 is different in thickness between over the second level interconnection layer 105 and over the first level metal contact plug 103, for which reason the second level through holes formed in the second level inter-layer insulator 104 are different in depth between over the second level interconnection layer 105 and over the first level metal contact plug 103.

The above described third conventional semiconductor device as shown in FIG. 2 is disadvantageous in the following viewpoints. The second level contact holes are different in depth between over the first level contact plug 103 and over the second level interconnection layer 105. The second level contact hole positioned over the second level interconnection layer 105 is shallower than the second level contact hole positioned over the first level contact plug 103. Namely, the second level contact hole positioned over the first level contact plug 103 is deeper than the second level contact hole positioned over the second level interconnection layer 105. This means that the second level contact hole positioned over the first level contact plug 103 is higher in aspect ratio than the second level contact hole positioned over the second level interconnection layer 105, wherein the aspect ratio of the through hole is defined to be a depth of the through hole to a diameter of the through hole. The higher aspect ratio of the through hole makes it difficult to realize a perfect or complete etching process to form the through hole and to fill completely the through hole with the metal layer.

Meanwhile, a first conventional method of forming a semiconductor device having a multilevel interconnection structure is proposed and disclosed in Japanese laid-open patent publication No. 11-126820. This first conventional method will be described as follows. Trench isolation films are selectively formed on a semiconductor substrate to define a device formation region surrounded by the trench isolation films. A gate insulation film is formed on the device formation region. A gate electrode is formed on the gate insulation film. Lightly doped regions are selectively formed in the device formation region except under the gate electrode by a first selective ion-implantation using the gate electrode as a mask, wherein the lightly doped regions are self-aligned to the gate electrode. Side wall insulation films are selectively formed on side walls of the gate electrode. Source and drain regions are selectively formed in the device formation region except under the gate electrode and the side wall insulation films by a second selective ion-implantation using the gate electrode and the side wall insulation films as masks, wherein the source and drain regions are self-aligned to the side wall insulation films. As a result, an MOS field effect transistor is formed in the device formation region. A substrate covering film is entirely formed which covers the MOS field effect transistor. A bottom carbon film is formed on the substrate covering film. A bottom silicon dioxide film is formed on the bottom carbon film. A top carbon film is formed on the bottom silicon dioxide film. Interconnection grooves are selectively formed in the top carbon film by a selective anisotropic etching with use of the bottom silicon dioxide film as a stopper. Contact holes are selectively formed which vertically extend from the bottoms of the interconnection grooves to the source and drain regions of the MOS field effect transistor, whereby parts of the source and drain regions are shown through the contact holes. A barrier metal layer is deposited on the shown parts of the source and drain regions and side walls of the contact holes and the bottom of the interconnection groove. A copper layer is also deposited on the barrier metal layer, so that laminations of the barrier metal layer and the copper layer fill both the interconnection groove and the contact holes, whereby interconnections are formed in the interconnection grooves whilst contact plugs are formed in the contact holes. Each of the interconnections and the contact plugs comprises the laminations of the barrier metal layer and the copper layer. The interconnections are connected through the contact plugs to the source and drain regions of the MOS field effect transistor. As a result, a single level interconnection structure has been completed. The above described processes for forming the interconnection structure will be repeated to form a multilevel interconnection structure. A passivation film of silicon dioxide is formed as a top layer over the multilevel interconnection structure. An opening is formed which extends from the silicon dioxide passivation film to the gate electrode of the MOS field effect transistor. An oxygen ashing process to selectively remove the top and bottom carbon films, whereby air-layers are formed around the interconnection and the contact plugs. As a result, the multilevel hollow interconnection structure has been completed.

The first level and second level contact plugs 103 and 106 and the interconnection 105 are formed by two separate processes using independent patterns. Even the contact plugs 103 and 106 and the interconnection 105 are the same in scale or size as each other, then a misalignment or displacement in alignment may be caused in each of the lithography processes, whereby it is possible that the second level contact hole is misaligned to or displaced from the first level contact hole, and namely the second level contact plug 106 is misaligned to or displaced from the first level contact plug 103.

Further, the first level and second level contact plugs 103 and 106 are formed by the two separate processes, for which reason if each of the first level and second level contact plugs 103 and 106 comprises laminations of a barrier metal layer and a conductive metal layer, then the barrier metal layer resides only the side wall of the first level contact hole.

In the above circumstances, it had been required to develop a novel semiconductor device having a multilevel interconnection structure free from the above problems and a method of forming the same.

SUMMARY OF THE INVENTION

Accordingly, it is an object of the present invention to provide a novel semiconductor device having a multilevel interconnection structure free from the above problems.

It is a further object of the present invention to provide a novel semiconductor device having a multilevel interconnection structure with reduced necessary number of interconnection patterns serving as interconnection pads in intermediate levels.

It is a still further object of the present invention to provide a novel semiconductor device having a multilevel interconnection structure which allows reducing the necessary number of lithography processes and etching processes for forming intermediate level interconnection structures.

It is yet a further object of the present invention to provide a novel multilevel interconnection structure free from the above problems.

It is further more object of the present invention to provide a novel multilevel interconnection structure with reduced necessary number of interconnection patterns serving as interconnection pads in intermediate levels.

It is still further more object of the present invention to provide a novel multilevel interconnection structure having a multilevel interconnection structure which allows reducing the necessary number of lithography processes and etching processes for forming intermediate level interconnection structures.

It is another object of the present invention to provide a novel method of forming a semiconductor device having a multilevel interconnection structure free from the above problems.

It is further another object of the present invention to provide a novel method of forming a semiconductor device having a multilevel interconnection structure with reduced necessary number of interconnection patterns serving as interconnection pads in intermediate levels.

It is still another object of the present invention to provide a novel method of forming a semiconductor device having a multilevel interconnection structure which allows reducing the necessary number of lithography processes and etching processes for forming intermediate level interconnection structures.

It is yet another object of the present invention to provide a novel method of forming a multilevel interconnection structure free from the above problems.

It is further more another object of the present invention to provide a novel method of forming a multilevel interconnection structure with reduced necessary number of interconnection patterns serving as interconnection pads in intermediate levels.

It is still further more another object of the present invention to provide a novel multilevel interconnection structure having a multilevel interconnection structure which allows reducing the necessary number of lithography processes and etching processes for forming intermediate level interconnection structures.

The present invention provides a multilevel interconnection structure comprising: at least a set of a first lower level contact plug extending in a lower level inter-layer insulator structure and a first higher level contact plug extending in a higher level inter-layer insulator structure extending over the lower level inter-layer insulator structure, wherein a top of the first lower level contact plug is contact directly with a bottom of the first higher level contact plug without intervening any interconnection pad a stopper insulating film extending between the lower level inter-layer insulator structure and the higher level inter-layer insulator structure; and at least a lower-level single conductive united structure which further comprises: a second lower level contact plug extending in the lower level inter-layer insulator structure; and a first lower level interconnection extending in a lower-level interconnection groove formed in an upper region of the lower level inter-layer insulator structure, wherein a top surface of the first lower level interconnection is leveled to a top surface of the lower level inter-layer insulator structure and also leveled to the top of the first lower level contact plug.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

Figure 1:
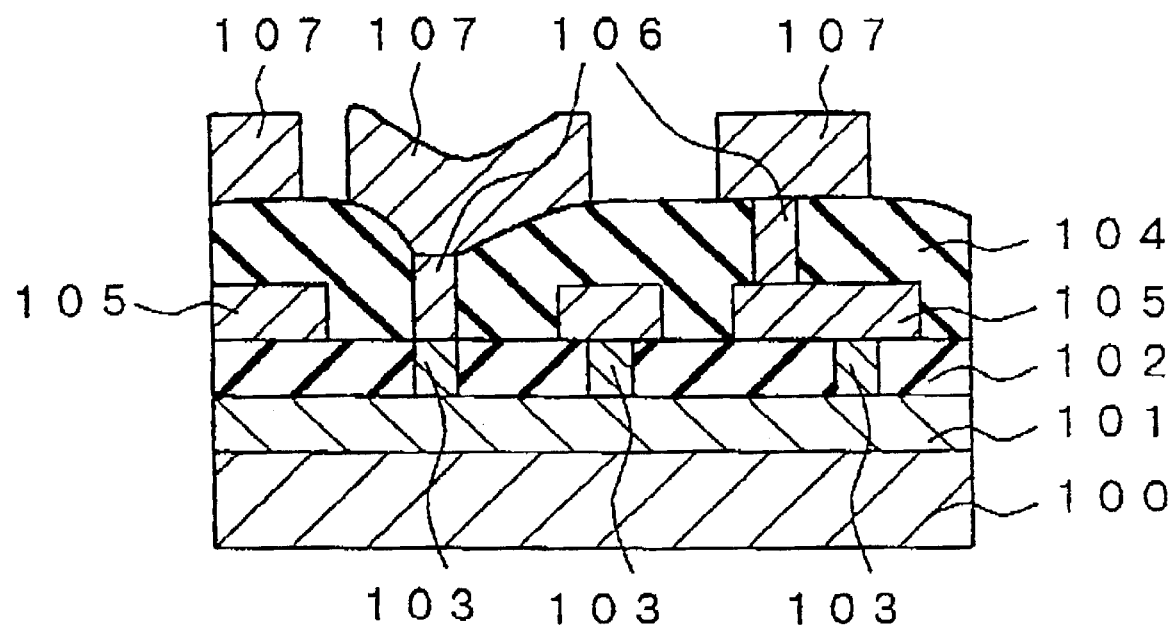
FIG. 1 is a fragmentary cross sectional elevation view illustrative of the second conventional multilevel interconnection structure of the integrated circuit.
Figure 2:
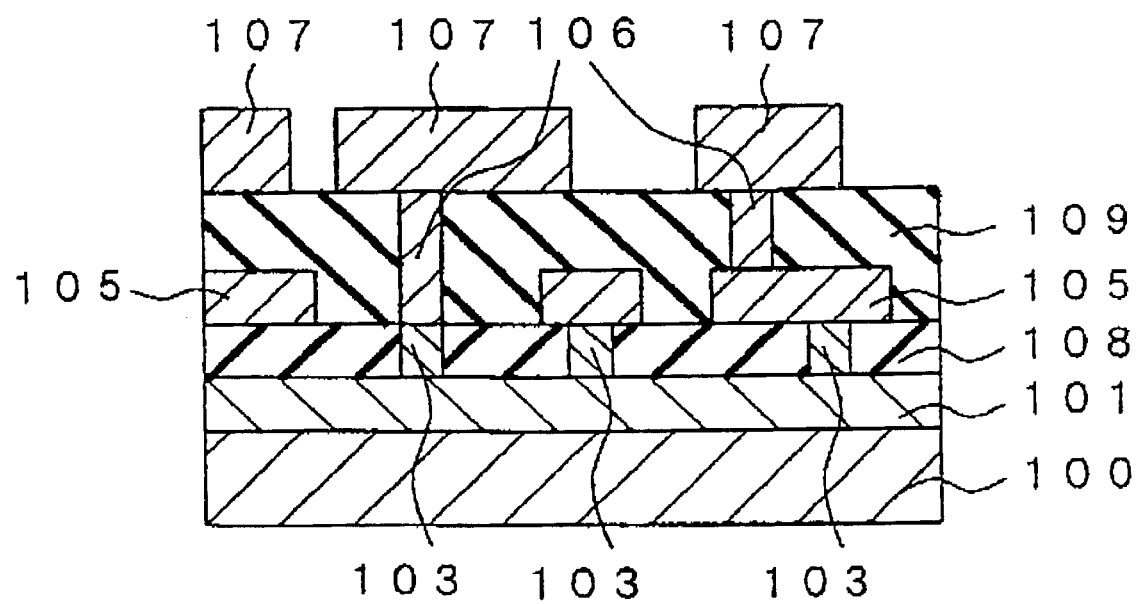
FIG. 2 is a fragmentary cross sectional elevation view illustrative of the third conventional multilevel interconnection structure of the integrated circuit.

The first present invention provides a multilevel interconnection structure comprising: at least a set of a first lower level contact plug extending in a lower level inter-layer insulator structure and a first higher level contact plug extending in a higher level inter-layer insulator structure extending over the lower level inter-layer insulator structure, wherein a top of the first lower level contact plug is contact directly with a bottom of the first higher level contact plug without intervening any interconnection pad.

It is preferable that the first higher level contact plug is larger in diameter than the first lower level contact plug.

It is also preferable that the first lower level contact plug is connected directly with a first semiconductor device formed on a semiconductor substrate, on which the lower level inter-layer insulator structure is provided.

It is preferable to further comprise: a first upper-level interconnection connected directly with a top of the first higher level contact plug.

It is furthermore preferable that the first upper-level interconnection extends over a top surface of the higher level inter-layer insulator structure.

It is also preferable that the first upper-level interconnection extends in a first upper-level interconnection groove formed in a first upper region of the higher level inter-layer insulator structure, so that a top surface of the first upper-level interconnection is leveled to a top surface of the higher level inter-layer insulator structure.

It is also preferable to further comprise a stopper insulating film extending between the lower level inter-layer insulator structure and the higher level inter-layer insulator structure.

It is further preferable to further comprise: at least a lower-level single conductive united structure which further more comprises: a second lower level contact plug extending in the lower level inter-layer insulator structure; and a first lower level interconnection extending in a lower-level interconnection groove formed in an upper region of the lower level inter-layer insulator structure, wherein a top surface of the first lower level interconnection is leveled to a top surface of the lower level inter-layer insulator structure and also leveled to the top of the first lower level contact plug.

It is moreover preferable to further comprise: a second upper-level contact plug extending in the upper level inter-layer insulator structure, a bottom of the second upper-level contact plug being connected directly with a part of a top surface of the first lower level interconnection; and a second upper-level interconnection connected directly with a part of a top of the second upper-level contact plug.

It is still more preferable that the second upper-level interconnection extends over a top surface of the higher level inter-layer insulator structure.

It is also preferable that the second upper-level interconnection extends in a second upper-level interconnection groove formed in a second upper region of the higher level inter-layer insulator structure, so that a top surface of the second upper-level interconnection is leveled to a top surface of the higher level inter-layer insulator structure.

The second present invention also provides a multilevel interconnection structure comprising: at least a set of a first lower level contact plug extending in a lower level inter-layer insulator structure and a first higher level contact plug extending in a higher level inter-layer insulator structure extending over the lower level inter-layer insulator structure, wherein a top of the first lower level contact plug is contact directly with a bottom of the first higher level contact plug without intervening any interconnection pad; a stopper insulating film extending between the lower level inter-layer insulator structure and the higher level inter-layer insulator structure; and at least a lower-level single conductive united structure which further comprises: a second lower level contact plug extending in the lower level inter-layer insulator structure; and a first lower level interconnection extending in a lower-level interconnection groove formed in an upper region of the lower level inter-layer insulator structure, wherein a top surface of the first lower level interconnection is leveled to a top surface of the lower level inter-layer insulator structure and also leveled to the top of the first lower level contact plug.

It is preferable that the first higher level contact plug is larger in diameter than the first lower level contact plug.

It is also preferable that the first lower level contact plug is connected directly with a first semiconductor device formed on a semiconductor substrate, on which the lower level inter-layer insulator structure is provided.

It is further preferable to further comprise: a first upper-level interconnection connected directly with a top of the first higher level contact plug.

It is further more preferable that the first upper-level interconnection extends over a top surface of the higher level inter-layer insulator structure.

It is moreover preferable that the first upper-level interconnection extends in a first upper-level interconnection groove formed in a first upper region of the higher level inter-layer insulator structure, so that a top surface of the first upper-level interconnection is leveled to a top surface of the higher level inter-layer insulator structure.

It is also preferable to further comprise: a second upper-level contact plug extending in the upper level inter-layer insulator structure, a bottom of the second upper-level contact plug being connected directly with a part of a top surface of the first lower level interconnection; and a second upper-level interconnection connected directly with a part of a top of the second upper-level contact plug.

It is also preferable that the second upper-level interconnection extends over a top surface of the higher level inter-layer insulator structure.

It is also preferable that the second upper-level interconnection extends in a second upper-level interconnection groove formed in a second upper region of the higher level inter-layer insulator structure, so that a top surface of the second upper-level interconnection is leveled to a top surface of the higher level inter-layer insulator structure.

The third present invention also provides a multilevel interconnection structure comprising: at least a set of a first lower level contact plug extending in a lower level inter-layer insulator structure and a first higher level contact plug extending in a higher level inter-layer insulator structure extending over the lower level inter-layer insulator structure, wherein a top of the first lower level contact plug is contact directly with a bottom of the first higher level contact plug without intervening any interconnection pad; a stopper insulating film extending between the lower level inter-layer insulator structure and the higher level inter-layer insulator structure; at least a lower-level single conductive united structure which further comprises: a second lower level contact plug extending in the lower level inter-layer insulator structure; and a first lower level interconnection extending in a lower-level interconnection groove formed in an upper region of the lower level inter-layer insulator structure, wherein a top surface of the first lower level interconnection is leveled to a top surface of the lower level inter-layer insulator structure and also leveled to the top of the first lower level contact plug; a first upper-level interconnection connected directly with a top of the first higher level contact plug; a second upper-level contact plug extending in the upper level inter-layer insulator structure, a bottom of the second upper-level contact plug being connected directly with a part of a top surface of the first lower level interconnection; and a second upper-level interconnection connected directly with a part of a top of the second upper-level contact plug.

It is preferable that the first higher level contact plug is larger in diameter than the first lower level contact plug.

It is also preferable that the first lower level contact plug is connected directly with a first semiconductor device formed on a semiconductor substrate, on which the lower level inter-layer insulator structure is provided.

It is further preferable that the first upper-level interconnection extends over a top surface of the higher level inter-layer insulator structure.

It is furthermore preferable that the first upper-level interconnection extends in a first upper-level interconnection groove formed in a first upper region of the higher level inter-layer insulator structure, so that a top surface of the first upper-level interconnection is leveled to a top surface of the higher level inter-layer insulator structure.

It is also preferable that the second upper-level interconnection extends over a top surface of the higher level inter-layer insulator structure.

It is also preferable that the second upper-level interconnection extends in a second upper-level interconnection groove formed in a second upper region of the higher level inter-layer insulator structure, so that a top surface of the second upper-level interconnection is leveled to a top surface of the higher level inter-layer insulator structure.

The fourth present invention also provides a method of a multilevel interconnection structure. The method comprises the steps of: forming a lower-level inter-layer insulator structure over a semiconductor substrate; forming both at least a first lower-level contact hole penetrating the lower-level inter-layer insulator structure and at least a set of a second lower-level contact hole in the lower-level inter-layer insulator structure except in an upper region thereof and a first lower-level interconnection groove in the upper region thereof; forming a lower level conductive layered structure which completely fills the first and second lower-level contact holes and the first lower-level interconnection groove and which also extends over a top surface of the lower-level inter-layer insulator structure; and selectively removing the lower level conductive layered structure so that the top surface of the lower-level inter-layer insulator structure is shown and also the lower level conductive layered structure remains only within the first and second lower-level contact holes and the first lower-level interconnection groove, whereby a first lower-level contact plug is formed in the lower-level contact hole, and a lower-level single conductive united structure is formed, which further comprises: a second lower-level contact plug extending in the second lower-level contact hole and a first lower-level interconnection extending in the first lower-level interconnection groove, wherein a top surface of the first lower level interconnection is leveled to a top surface of the lower level inter-layer insulator structure and also leveled to the top of the first lower level contact plug to form a lower-level planarized surface.

It is preferable that the lower level conductive layered structure is selectively removed by a chemical mechanical polishing method.

It is further preferable that the lower-level inter-layer insulator structure is formed by the steps of: forming a lower level inter-layer insulator on the semiconductor substrate; and forming a stopper insulating film on the lower level inter-layer insulator, so that the stopper insulating film serves as a polishing stopper in the chemical mechanical polishing method.

It is also preferable that the first and second lower-level contact holes are formed in a first lithography process before the first lower-level interconnection groove is formed in a second lithography process.

It is also preferable that the first lower-level interconnection groove is formed in a first lithography process before the first and second lower-level contact holes are formed in a second lithography process.

It is also preferable that the method further comprises the additional steps of: forming a higher-level inter-layer insulator structure over the lower-level planarized surface; forming both at least a first set of a first higher-level contact hole in the higher-level inter-layer insulator structure except in an upper region thereof and a first higher-level interconnection groove extending in the upper region thereof and being connected with a top of the first higher-level contact hole, and at least a second set of a second higher-level contact hole in the higher-level inter-layer insulator structure except in an upper region thereof and a second higher-level interconnection groove extending in the upper region thereof and being connected with a top of the second higher-level contact hole, wherein the first higher-level contact hole is positioned over and aligned to the first lower-level contact plug, whilst the second higher-level contact hole is positioned over a part of the top surface of the first lower-level interconnection; forming a higher level conductive layered structure which completely fills the first and second higher-level contact holes and the first and second higher-level interconnection grooves and which also extends over a top surface of the higher-level inter-layer insulator structure; and selectively removing the higher level conductive layered structure so that the top surface of the higher-level inter-layer insulator structure is shown and also the higher level conductive layered structure remains only within the first and second higher-level contact holes and the first and second higher-level interconnection grooves, whereby a first higher-level single conductive united structure is formed, which further comprises: a first higher-level contact plug extending in the first higher-level contact hole and being in contact directly with the top of the first lower-level contact plug; and a first higher-level interconnection extending in the first higher-level interconnection groove, wherein a second higher-level single conductive united structure is formed, which further comprises: a second higher-level contact plug extending in the second higher-level contact hole and being in contact directly with the part of the top surface of the first lower-level interconnection; and a second higher-level interconnection extending in the first higher-level interconnection groove, and wherein a top surface of the first higher level interconnection is leveled to a top surface of the higher level inter-layer insulator structure and also leveled to a top surface of the second higher level interconnection to form a higher-level planarized surface.

It is further preferable that the higher level conductive layered structure is selectively removed by a chemical mechanical polishing method.

It is also preferable that the first and second high-level contact holes are formed in a third lithography process before the first and second higher-level interconnection grooves are formed in a fourth lithography process.

It is also preferable that the first and second higher-level interconnection grooves are formed in a third lithography process before the first and second lower-level contact holes are formed in a fourth lithography process.

It is also preferable that the method further comprises the additional steps of: forming a higher-level inter-layer insulator structure over the lower-level planarized surface; forming both first and second higher-level contact holes penetrating the higher-level inter-layer insulator structure, wherein the first higher-level contact hole is positioned over and aligned to the first lower-level contact plug, whilst the second higher-level contact hole is positioned over a part of the top surface of the first lower-level interconnection; forming a higher level conductive layered structure which completely fills the first and second higher-level contact holes and which also extends over a top surface of the higher-level inter-layer insulator structure; and selectively removing the higher level conductive layered structure so that the top surface of the higher-level inter-layer insulator structure is shown and also the higher level conductive layered structure remains only within the first and second higher-level contact holes, whereby a first higher-level contact plug is formed in the first higher-level contact hole and is in contact directly with the top of the first lower-level contact plug, wherein a second higher-level contact plug is formed in the second higher-level contact hole and is in contact directly with the part of the top surface of the first lower-level interconnection, and wherein a top of the higher-level contact plug is leveled to a top surface of the higher level inter-layer insulator structure and also leveled to a top of the second higher-level contact plug to form a higher-level planarized surface.

It is further preferable that the higher level conductive layered structure is selectively removed by an etch-back method.

It is further more preferable that the method further comprises the further additional steps of: forming first and second higher-level interconnections over the higher-level planarized surface, so that the first higher-level interconnection is connected with the first higher-level contact plug, and the second higher-level interconnection is connected with the second higher-level contact plug.

The fifth present invention provides a method of a multilevel interconnection structure. The method comprises the steps of: forming a lower-level inter-layer insulator structure over a semiconductor substrate; forming both at least a first lower-level contact hole penetrating the lower-level inter-layer insulator structure and at least a set of a second lower-level contact hole in the lower-level inter-layer insulator structure except in an upper region thereof and a first lower-level interconnection groove in the upper region thereof; forming a lower level conductive layered structure which completely fills the first and second lower-level contact holes and the first lower-level interconnection groove and which also extends over a top surface of the lower-level inter-layer insulator structure; selectively removing the lower level conductive layered structure so that the top surface of the lower-level inter-layer insulator structure is shown and also the lower level conductive layered structure remains only within the first and second lower-level contact holes and the first lower-level interconnection groove, whereby a first lower-level contact plug is formed in the lower-level contact hole, and a lower-level single conductive united structure is formed, which further comprises: a second lower-level contact plug extending in the second lower-level contact hole and a first lower-level interconnection extending in the first lower-level interconnection groove, wherein a top surface of the first lower level interconnection is leveled to a top surface of the lower level inter-layer insulator structure and also leveled to the top of the first lower level contact plug to form a lower-level planarized surface; forming a higher-level inter-layer insulator structure over the lower-level planarized surface forming both at least a first set of a first higher-level contact hole in the higher-level inter-layer insulator structure except in an upper region thereof and a first higher-level interconnection groove extending in the upper region thereof and being connected with a top of the first higher-level contact hole, and at least a second set of a second higher-level contact hole in the higher-level inter-layer insulator structure except in an upper region thereof and a second higher-level interconnection groove extending in the upper region thereof and being connected with a top of the second higher-level contact hole, wherein the first higher-level contact hole is positioned over and aligned to the first lower-level contact plug, whilst the second higher-level contact hole is positioned over a part of the top surface of the first lower-level interconnection; forming a higher level conductive layered structure which completely fills the first and second higher-level contact holes and the first and second higher-level interconnection grooves and which also extends over a top surface of the higher-level inter-layer insulator structure; and selectively removing the higher level conductive layered structure so that the top surface of the higher-level inter-layer insulator structure is shown and also the higher level conductive layered structure remains only within the first and second higher-level contact holes and the first and second higher-level interconnection grooves, whereby a first higher-level single conductive united structure is formed, which further comprises: a first higher-level contact plug extending in the first higher-level contact hole and being in contact directly with the top of the first lower-level contact plug; and a first higher-level interconnection extending in the first higher-level interconnection groove, wherein a second higher-level single conductive united structure is formed, which further comprises: a second higher-level contact plug extending in the second higher-level contact hole and being in contact directly with the part of the top surface of the first lower-level interconnection; and a second higher-level interconnection extending in the first higher-level interconnection groove, and wherein a top surface of the first higher level interconnection is leveled to a top surface of the higher level inter-layer insulator structure and also leveled to a top surface of the second higher level interconnection to form a higher-level planarized surface.

It is preferable that the lower level conductive layered structure is selectively removed by a chemical mechanical polishing method.

It is further preferable that the lower-level inter-layer insulator structure is formed by the steps of: forming a lower level inter-layer insulator on the semiconductor substrate; and forming a stopper insulating film on the lower level inter-layer insulator, so that the stopper insulating film serves as a polishing stopper in the chemical mechanical polishing method.

It is also preferable that the first and second lower-level contact holes are formed in a first lithography process before the first lower-level interconnection groove is formed in a second lithography process.

It is also preferable that the first lower-level interconnection groove is formed in a first lithography process before the first and second lower-level contact holes are formed in a second lithography process.

It is also preferable that the higher level conductive layered structure is selectively removed by a chemical mechanical polishing method.

It is also preferable that the first and second high-level contact holes are formed in a third lithography process before the first and second higher-level interconnection grooves are formed in a fourth lithography process.

It is also preferable that the first and second higher-level interconnection grooves are formed in a third lithography process before the first and second lower-level contact holes are formed in a fourth lithography process.

The sixth present invention provides a method of a multilevel interconnection structure. The method comprises the steps of: forming a lower-level inter-layer insulator structure over a semiconductor substrate; forming both at least a first lower-level contact hole penetrating the lower-level inter-layer insulator structure and at least a set of a second lower-level contact hole in the lower-level inter-layer insulator structure except in an upper region thereof and a first lower-level interconnection groove in the upper region thereof; forming a lower level conductive layered structure which completely fills the first and second lower-level contact holes and the first lower-level interconnection groove and which also extends over a top surface of the lower-level inter-layer insulator structure; selectively removing the lower level conductive layered structure so that the top surface of the lower-level inter-layer insulator structure is shown and also the lower level conductive layered structure remains only within the first and second lower-level contact holes and the first lower-level interconnection groove, whereby a first lower-level contact plug is formed in the lower-level contact hole, and a lower-level single conductive united structure is formed, which further comprises: a second lower-level contact plug extending in the second lower-level contact hole; and a first lower-level interconnection extending in the first lower-level interconnection groove, wherein a top surface of the first lower level interconnection is leveled to a top surface of the lower level inter-layer insulator structure and also leveled to the top of the first lower level contact plug to form a lower-level planarized surface; forming a higher-level inter-layer insulator structure over the lower-level planarized surface; forming both first and second higher-level contact holes penetrating the higher-level inter-layer insulator structure, wherein the first higher-level contact hole is positioned over and aligned to the first lower-level contact plug, whilst the second higher-level contact hole is positioned over a part of the top surface of the first lower-level interconnection;

forming a higher level conductive layered structure which completely fills the first and second higher-level contact holes and which also extends over a top surface of the higher-level inter-layer insulator structure; and selectively removing the higher level conductive layered structure so that the top surface of the higher-level inter-layer insulator structure is shown and also the higher level conductive layered structure remains only within the first and second higher-level contact holes, whereby a first higher-level contact plug is formed in the first higher-level contact hole and is in contact directly with the top of the first lower-level contact plug, wherein a second higher-level contact plug is formed in the second higher-level contact hole and is in contact directly with the part of the top surface of the first lower-level interconnection, and wherein a top of the higher-level contact plug is leveled to a top surface of the higher level inter-layer insulator structure and also leveled to a top of the second higher-level contact plug to form a higher-level planarized surface.

It is preferable that the lower level conductive layered structure is selectively removed by a chemical mechanical polishing method.

It is further preferable that the lower-level inter-layer insulator structure is formed by the steps of: forming a lower level inter-layer insulator on the semiconductor substrate; and forming a stopper insulating film on the lower level inter-layer insulator, so that the stopper insulating film serves as a polishing stopper in the chemical mechanical polishing method.

It is also preferable that the first and second lower-level contact holes are formed in a first lithography process before the first lower-level interconnection groove is formed in a second lithography process.

It is also preferable that the first lower-level interconnection groove is formed in a first lithography process before the first and second lower-level contact holes are formed in a second lithography process.

It is also preferable that the higher level conductive layered structure is selectively removed by an etch-back method.

It is preferable to further comprise the steps of: forming first and second higher-level interconnections over the higher-level planarized surface, so that the first higher-level interconnection is connected with the first higher-level contact plug, and the second higher-level interconnection is connected with the second higher-level contact plug.

PREFERRED EMBODIMENTS
FIRST EMBODIMENT

Figure 3:
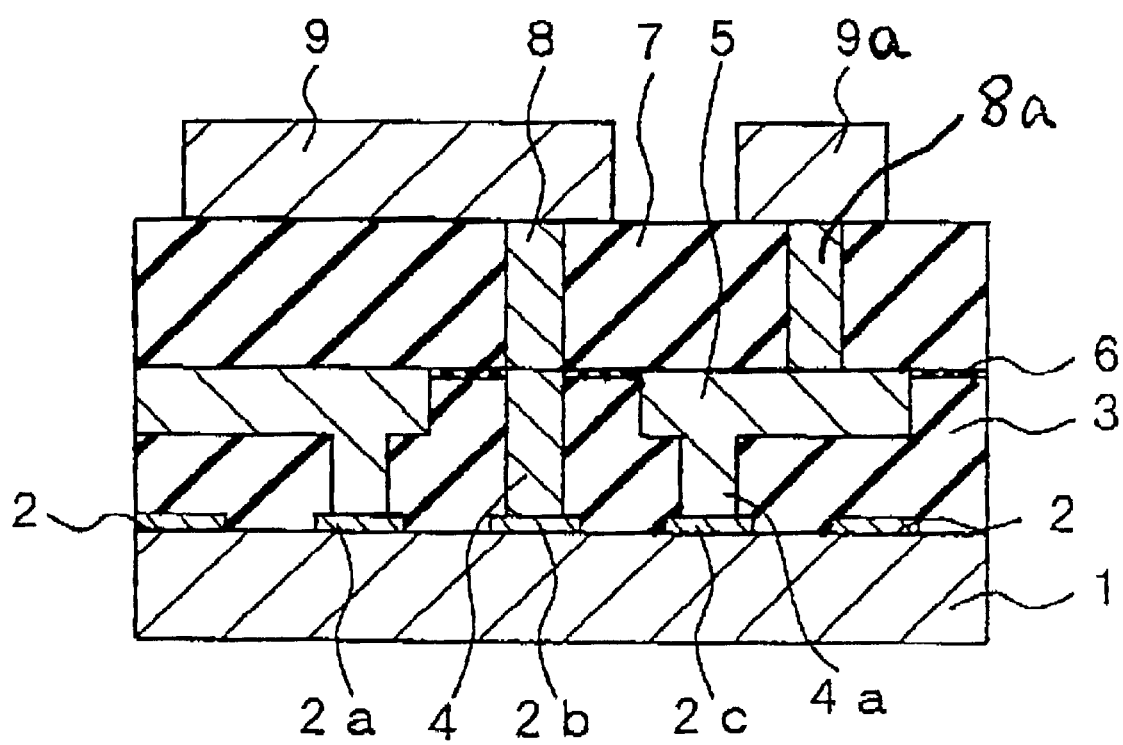
FIG. 3 is a first novel multilevel interconnection structure of a semiconductor integrated circuit in a first embodiment in accordance with the present invention.

A first embodiment according to the present invention will be described in detail with reference to the drawings. FIG. 3 is a first novel multilevel interconnection structure of a semiconductor integrated circuit in a first embodiment in accordance with the present invention. A semiconductor substrate 1 is prepared which has an integration of plural semiconductor devices which include field effect transistors such as MOS field effect transistors. First level interconnections 2 as a first level conductive layer and partially serving as gate electrodes of the MOS field effect transistors are selectively provided which extend over a top surface of the semiconductor substrate 1. A first level inter-layer insulator 3 is entirely provided which extends over the first level interconnections 2 and the top surface of the semiconductor substrate 1, whereby the first level interconnections 2 and the top surface of the semiconductor substrate 1 are completely covered by the first level inter-layer insulator 3. A stopper film 6 is provided which extends over the top surface of the first level inter-layer insulator 3. A first first-level contact hole is provided in the first level inter-layer insulator 3 and the stopper film 6, so that the first first-level contact hole penetrates the first level inter-layer insulator 3 and the stopper film 6 and reaches a part of the top surface of the first level interconnection 2b as one of the plural first level interconnections 2. A first first-level contact plug 4 is provided within the first first-level contact hole, so that the first first-level contact plug 4 penetrates the first level inter-layer insulator 3 and the stopper film 6 and reaches a part of the top surface of the first level interconnection 2b as one of the plural first level interconnections 2, whereby the first first-level contact plug 4 is connected with the first level interconnection 2b. Second first-level contact holes are provided which penetrate the first level inter-layer insulator 3 and reach parts of the top surfaces of the first level interconnections 2a and 2c as others of the plural first level interconnections 2. Second level interconnection grooves are selectively provided in an upper region of the first level inter-layer insulator 3, so that the second level interconnection grooves are connected with the second first-level contact holes. Second first-level contact plugs 4a are provided within the second first-level contact holes, so that the second first-level contact plugs 4a reach parts of the top surfaces of the first level interconnections 2a and 2c as others of the plural first level interconnections 2, whereby the second first-level contact plugs 4a are connected with the first level interconnections 2a and 2c as others of the plural first level interconnections 2. Second level interconnections 5 as a second conductive layer are provided which extend in the second level interconnection grooves, so that the second level interconnections 5 are connected through the second first-level contact plugs 4a to the first level interconnections 2a and 2c as others of the plural first level interconnections 2. A set of the second first-level contact plugs 4a and the second level interconnections 5 comprises a single conductive united structure which extends within the second first-level contact hole and the second level interconnection groove. Namely, the second first-level contact plug 4a comprises a part of the single conductive united structure extending in the second first-level contact hole, whilst the second level interconnection 5 comprises the remaining part of the single conductive united structure extending in the second level interconnection groove. The top of the first first-level contact plug 4 is leveled to the top surface of the stopper insulating layer 6 over the first level inter-layer insulator 3. Assuming that the laminations of the stopper insulating layer 6 and the first level inter-layer insulator 3 form a first level inter-layer insulator structure, then the top of the first first-level contact plug 4 is leveled to the top surface of the first level inter-layer insulator structure. The top of the second level interconnection 5 is leveled to the top surface of the stopper insulating layer 6 over the first level inter-layer insulator 3. Assuming that the laminations of the stopper insulating layer 6 and the first level inter-layer insulator 3 form the first level inter-layer insulator structure, then the top of the second level interconnection 5 is leveled to the top surface of the first level inter-layer insulator structure. Also, the second level interconnection 5 has the same top level as the first first-level contact plug 4. In summary, the tops of the second level interconnections 5, the first first-level contact plug 4 and the first level inter-layer insulator structure are leveled or planarized to form a planarized surface. A second level inter-layer insulator 7 is entirely provided on the planarized surface, so that the second level inter-layer insulator 7 extends over the tops of the second level interconnections 5, the first first-level contact plug 4 and the first level inter-layer insulator structure or the stopper insulating layer 6. A first second-level contact hole is provided in the second level inter-layer insulator 7, so that the first second-level contact hole is positioned over and just aligned to the first first-level contact plug 4. A second second-level contact hole is provided in the second level inter-layer insulator 7, so that the second second-level contact hole is positioned over the second level interconnection 5. A first second-level contact plug 8 is provided within the first second-level contact hole, so that the first second-level contact plug 8 penetrates the second level inter-layer insulator 7 and reaches the top of the first first-level contact plug 4, wherein the first second-level contact plug 8 in the second level inter-layer insulator 7 is just aligned to the first first-level contact plug 4 in the first level inter-layer insulator 3. The first second-level contact plug 8 is connected through the first first-level contact plug 4 to the first level interconnection 2b. A second second-level contact plug 8a is provided within the second second-level contact hole, so that the second second-level contact plug 8a penetrates the second level inter-layer insulator 7 and reaches a part of the top surface of the second level interconnection 5. The second second-level contact plug 8a is connected through the second level interconnection 5 and the second first-level contact plug 4a to the first level interconnection 2c. The top of the first second-level contact plug 8 is leveled to the top surface of the second level inter-layer insulator 7. The top of the second second-level contact plug 8a is also leveled to the top surface of the second level inter-layer insulator 7. The first second-level contact plug 8 and the second second-level contact plug 8a have the same top level as each other and also as the second level inter-layer insulator 7. The tops of the first second-level contact plug 8 and the second second-level contact plug 8a and the top surface of the second level inter-layer insulator 7 form a planarized surface. The first and second second-level contact plugs 8 and 8a have the same depth or height as each other. First and second third-level interconnections 9 and 9a are provided on the planarized surface, so that the first and second third-level interconnections 9 and 9a extend over the second level inter-layer insulator 7 and over the first second-level contact plug 8 and the second second-level contact plug 8a. The first third-level interconnection 9 is in contact with the top of the first second-level contact plug 8, whereby the first third-level interconnection 9 is connected through the first second-level contact plug 8, the first first-level contact plug 4 to the first level interconnection 2b. The second third-level interconnection 9a is in contact with the second second-level contact plug 8a, whereby the second third-level interconnection 9a is connected through the second second-level contact plug 8a, the second level interconnection 5 and the second first-level contact plug 4a to the first level interconnection 2c.

As described above, the first first-level contact plug 4 and the second level interconnection 5 provided in the first level inter-layer insulator structure have the same top level as each other, whereby the first and second second-level contact plugs 8 and 8a in the second level inter-layer insulator 7 have the same depth or height as each other. This makes it possible that the first second-level contact plug 8 and the first first-level contact plug 4 are connected directly with each other without intervening any interconnection pad in the mid-level, for example, the second level interconnection 5. This results in a certain reduction in the necessary number of the second level interconnections 5. Namely, the number of the interconnection pattern of the second level interconnections 5 is reduced. This contributes to increase the density of integration of the semiconductor integrated circuit having the multilevel interconnection structure.

The first first-level contact plug 4 is deeper than the second first-level contact plugs 4a by the thickness of the second level interconnections 5. The depth of the first first-level contact plug 4 is substantially the same as the thickness of the first-level inter-layer insulator 3. Generally, in accordance with the multilevel interconnection structure, however, the higher level interconnection has a larger thickness than the lower level interconnection. As far as the inter-layer insulators are completely planarized, the higher level inter-layer insulator is thicker than the lower level inter-layer insulator. Even the depth of the first first-level contact plug 4 is substantially the same as the thickness of the first-level inter-layer insulator 3, the thickness of the first-level inter-layer insulator 3 is not so large, for which reason the depth of the first first-level contact plug 4 is not so large. Namely, the aspect ratio of the first first-level contact plug 4 is not so large. Therefore, the aspect ratio of the first first-level contact plug 4 is not serious problem nor substantive problem.

Furthermore, the top surface of the second level inter-layer insulator 7 is completely planarized. All of the first and second second-level contact plugs 8 and 8a are uniform in depth. This makes it possible to reduce the depth of the first and second second-level contact plugs 8 and 8a or reduce the thickness of the second level inter-layer insulator 7. This makes it possible to reduce the aspect ratio of the first and second second-level contact plugs 8 and 8a.

A first novel method of forming the above described first novel multilevel interconnection structure of the semiconductor integrated circuit. FIGS. 4A through 4I are fragmentary cross sectional elevation views illustrative of a first novel method of forming the first novel multilevel interconnection structure of the semiconductor integrated circuit of FIG. 3 in the first embodiment in accordance with the present invention.

Figure 4A:
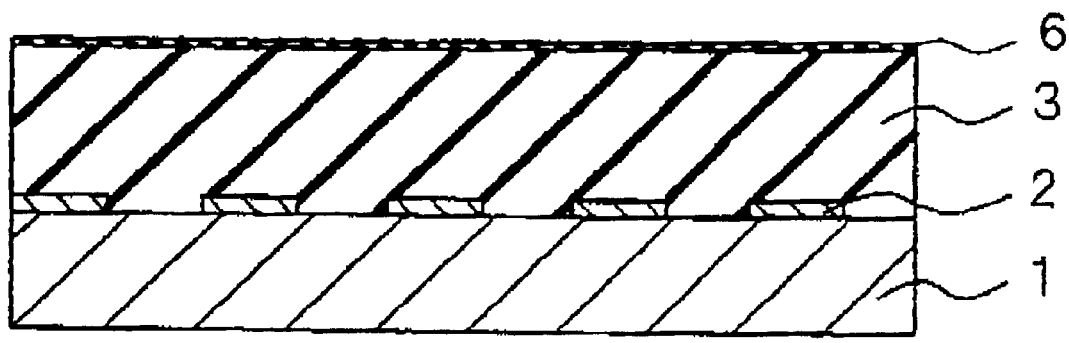
FIGS. 4A through 4I are fragmentary cross sectional elevation views illustrative of a first novel method of forming the first novel multilevel interconnection structure of the semiconductor integrated circuit of FIG. 3 in the first embodiment in accordance with the present invention.

With reference to FIG. 4A, a semiconductor substrate 1 is prepared which has an integration of plural semiconductor devices which include field effect transistors such as MOS field effect transistors. First level interconnections 2 as a first level conductive layer and partially serving as gate electrodes of the MOS field effect transistors are selectively formed which extend over a top surface of the semiconductor substrate 1. Each of the first level interconnections 2 may comprise a polycrystalline silicon layer or alternatively may comprise a refractory metal silicide layer. Each of the first level interconnections 2 may have a thickness of 150 nanometers. A first level inter-layer insulator 3 is entirely deposited which extends over the first level interconnections 2 and the top surface of the semiconductor substrate 1, whereby the first level interconnections 2 and the top surface of the semiconductor substrate 1 are completely covered by the first level inter-layer insulator 3. The top surface of the first level inter-layer insulator 3 is then planarized. The first level inter-layer insulator 3 may comprise a silicon dioxide film. The first level inter-layer insulator 3 may have a thickness of 250 nanometers. A stopper film 6 is formed which extends over the planarized top surface of the first level inter-layer insulator 3. The stopper film 6 may comprise a silicon nitride film. The stopper film 6 may have a thickness of 50 nanometers.

Figure 4B:
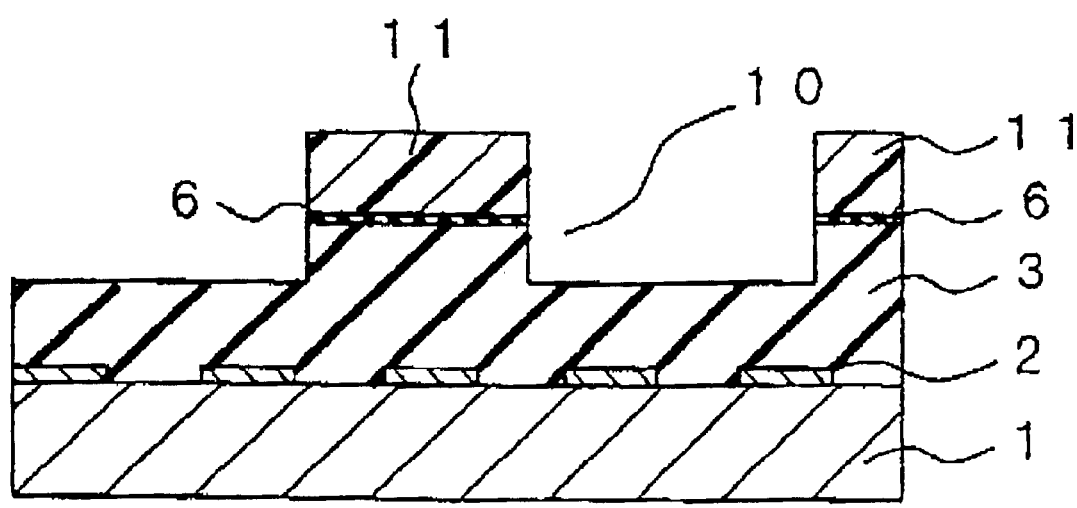

With reference to FIG. 4B, a first resist film is entirely formed on the top surface of the stopper film 6. The first resist film is then patterned by a lithography technique to form a first resist pattern 11 over the top surface of the stopper film 6. An anisotropic etching process is carried out by use of the first resist pattern 11 as a mask to selectively etch the stopper film 6 and the first level inter-layer insulator 3 up to a predetermined depth from the top surface of the first level inter-layer insulator 3, in order to form first grooves 10 in selected upper regions of the first level inter-layer insulator 3. The predetermined depth may be 150 nanometers, so that the first grooves 10 has a depth of 150 nanometers. The used first resist pattern 11 is removed.

Figure 4C:
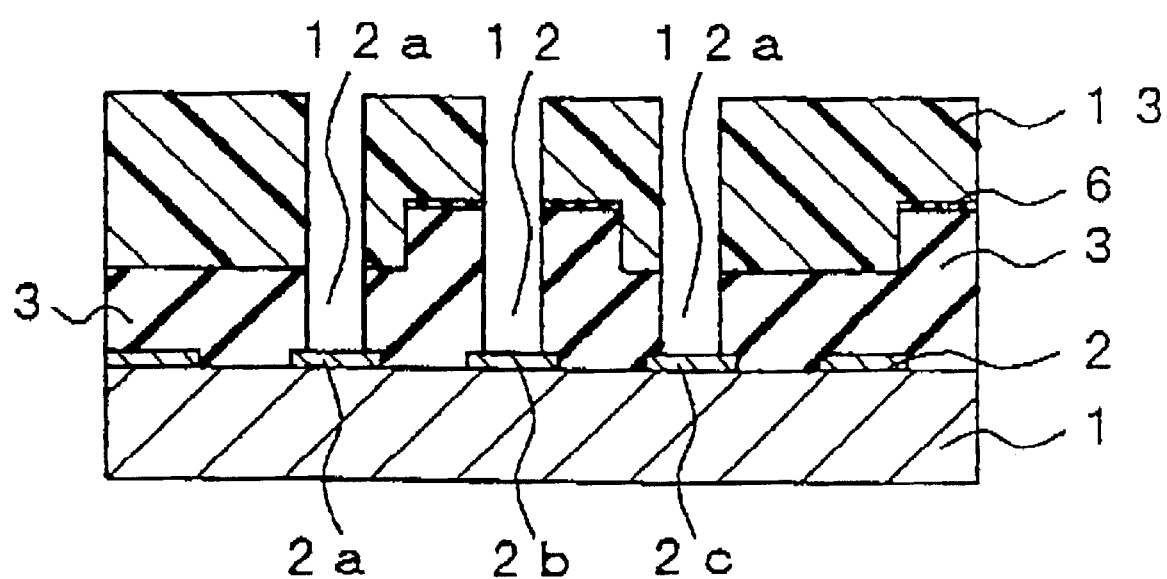

With reference to FIG. 4C, a second resist film is entirely applied on the top surface of the stopper film 6 and also on the bottoms and side walls of the first grooves 10 of the first level inter-layer insulator 3, so that the second resist film completely fills the first grooves 10. The second resist film is then patterned by a lithography technique to form a second resist pattern 13 over the top surface of the stopper film 6 and the first grooves 10 of the first level inter-layer insulator 3. An anisotropic etching process is carried out by use of the second resist pattern 13 as a mask to selectively etch the first level inter-layer insulator 3 under the first grooves 10, in order to form a first first-level contact hole 12 and second first-level contact holes 12a. The first first-level contact hole 12 penetrates the first level inter-layer insulator 3 and reaches a part of the top surface of the first level interconnection 2b as one of the plural first level interconnections 2. The second first-level contact holes 12a also penetrate the first level inter-layer insulator 3 and reach parts of the top surfaces of the first level interconnections 2a and 2b as others of the plural first level interconnections 2. The first first-level contact hole 12 may have a diameter of 250 nanometers. The second first-level contact holes 12a may have a diameter of 250 nanometers. The used second resist pattern 13 is removed.

Figure 4D:
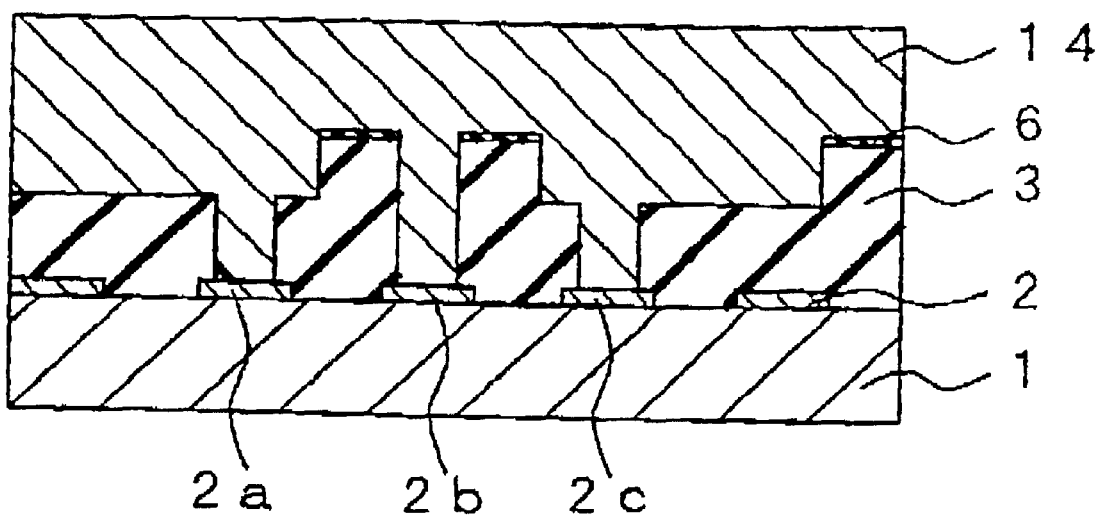

With reference to FIG. 4D, a first barrier metal layer is entirely deposited by a sputtering method or a chemical vapor deposition method on the top surface of the stopper insulating layer 6, the side walls and bottoms of the first grooves 10 of the first level inter-layer insulator 3 and the side walls of the first and second first-level contact holes 12 and 12a of the first level inter-layer insulator 3 as well as on the shown parts of the first level interconnections 2a, 2b and 2c. The first barrier metal layer may comprise a titanium nitride film. A first conductive layer is also entirely deposited on the first barrier metal layer by a sputtering method or a chemical vapor deposition method, so that the first conductive layer completely fills the first and second first-level contact holes 12 and 12a and the first grooves 10 and further extends over the stopper insulating layer 6, so as to form a first conductive layer 14 which comprises laminations of the first barrier metal layer and the conductive layer. The first conductive layer may comprise a tungsten layer. The first conductive layer 14 is much higher in polishing rate than the stopper insulating layer 6.

Figure 4E:
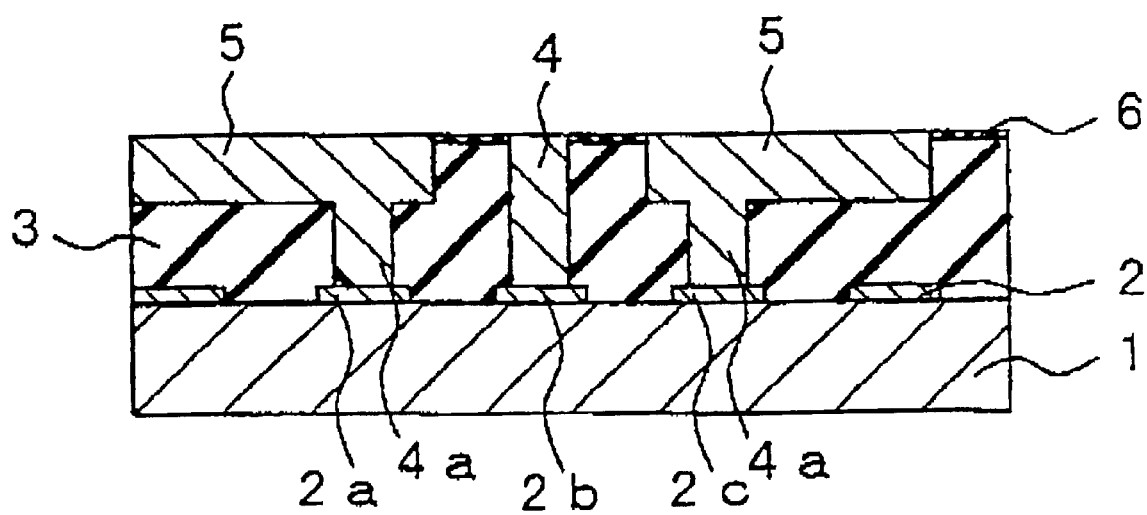

With reference to FIG. 4E, a planarization process, for example, a chemical mechanical polishing process is carried out for polishing the first conductive layer 14, wherein the stopper insulating layer 6 serves as a polishing stopper, so that the chemical mechanical polishing process to the first conductive layer 14 is stopped just when the top surface of the stopper insulating layer 6 is shown. The first conductive layer 14 remains within the first grooves 10 and the first and second first-level contact holes 12 and 12a. As a result, a first first-level contact plug 4 is formed within the first first-level contact hole 12, so that the first first-level contact plug 4 extends penetrating the first level inter-layer insulator 3 and the stopper film 6 and reaches the part of the top surface of the first level interconnection 2b as one of the plural first level interconnections 2, whereby the first first-level contact plug 4 is connected with the first level interconnection 2b. Further, second first-level contact plugs 4a are formed within the second first-level contact holes 12a, so that the second first-level contact plugs 4a reach parts of the top surfaces of the first level interconnections 2a and 2c as others of the plural first level interconnections 2, whereby the second first-level contact plugs 4a are connected with the first level interconnections 2a and 2c as others of the plural first level interconnections 2. Furthermore, second level interconnections 5 as a second conductive layer are formed which extend in the first grooves 10, so that the second level interconnections 5 are connected through the second first-level contact plugs 4a to the first level interconnections 2a and 2c as others of the plural first level interconnections 2. A set of the second first-level contact plug 4a in the second first-level contact hole 12a and the second level interconnection 5 in the first groove 10 comprises one remaining part of the first conductive layer 14. Namely, a single conductive united structure comprising one remaining part of the first conductive layer 14 extends within the second first-level contact hole 12a and the first groove 10. Namely, the second first-level contact plug 4a comprises a part of the single conductive united structure extending in the second first-level contact hole 12a, whilst the second level interconnection 5 comprises the remaining part of the single conductive united structure extending in the first groove 10. The top of the first first-level contact plug 4 is leveled to the top surface of the stopper insulating layer 6 over the first level inter-layer insulator 3. Assuming that the laminations of the stopper insulating layer 6 and the first level inter-layer insulator 3 form the first level inter-layer insulator structure, then the top of the first first-level contact plug 4 is leveled to the top surface of the first level inter-layer insulator structure. The top of the second level interconnection 5 is also leveled to the top surface of the stopper insulating layer 6 over the first level inter-layer insulator 3. Assuming that the laminations of the stopper insulating layer 6 and the first level inter-layer insulator 3 form the first level inter-layer insulator structure, then the top of the second level interconnection 5 is leveled to the top surface of the first level inter-layer insulator structure. Also, the second level interconnection 5 has the same top level as the first first-level contact plug 4. In summary, the tops of the second level interconnections 5, the first first-level contact plug 4 and the first level inter-layer insulator structure are leveled or planarized to form a planarized surface. This process is different from the dual damascene method in that the second level interconnections 5 do not extend over the first first-level contact plug 4.

Figure 4F:
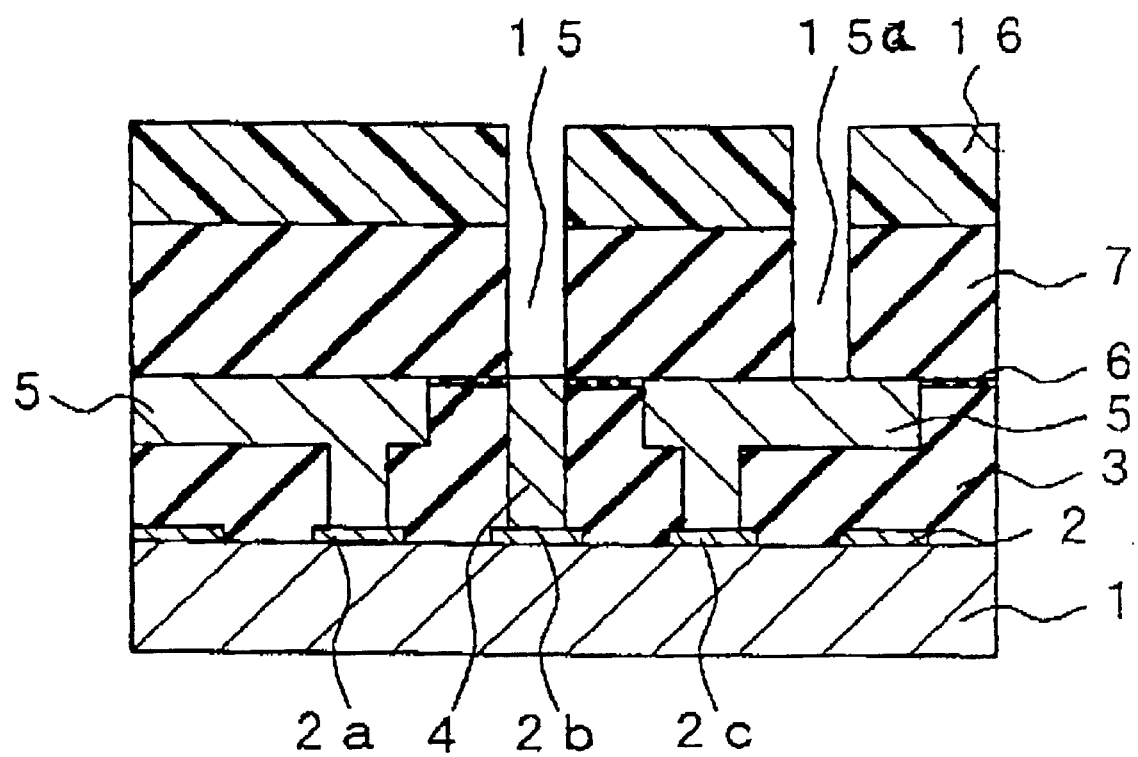

With reference to FIG. 4F, a second level inter-layer insulator 7 is entirely provided on the planarized surface, so that the second level inter-layer insulator 7 extends over the tops of the second level interconnections 5, the first first-level contact plug 4 and the first level inter-layer insulator structure or the stopper insulating layer 6. The second level inter-layer insulator 7 may comprise a silicon dioxide layer. The second level inter-layer insulator 7 may have a thickness of 400 nanometers. It is unnecessary to planarize the second level inter-layer insulator 7. A third resist film is entirely applied on the top surface of the second level inter-layer insulator 7. The third resist film is then patterned by a lithography technique to form a third resist pattern 16 over the second level inter-layer insulator 7. An anisotropic etching process is carried out by use of the third resist pattern 16 as a mask for selectively etching the second level inter-layer insulator 7 so as to form first and second second-level contact holes 15 and 15a in the second level inter-layer insulator 7. The first second-level contact hole 15 reaches the top of the first first-level contact plug 4, so that the first second-level contact hole 15 is positioned over and just aligned to the first first-level contact plug 4. The top of the first first-level contact plug 4 is shown through the first second-level contact hole 15. The second second-level contact hole 15a reaches a part of the top of the second level interconnection 5, so that the second second-level contact hole 15a is positioned over the second level interconnection 5. The part of the top of the second level interconnection 5 is shown through the second second-level contact hole 15a. The first second-level contact hole 15 may have a diameter in the range of 200 nanometers to 250 nanometers, so that the diameter of the first second-level contact hole 15 is smaller than or equal to the diameter of the first first-level contact plug 4. The second second-level contact hole 15a may also have a diameter in the range of 200 nanometers to 250 nanometers, so that the diameter of the second second-level contact hole 15a is smaller than or equal to the diameter of the first first-level contact plug 4. The used third resist pattern 16 is then removed.

Figure 4G:
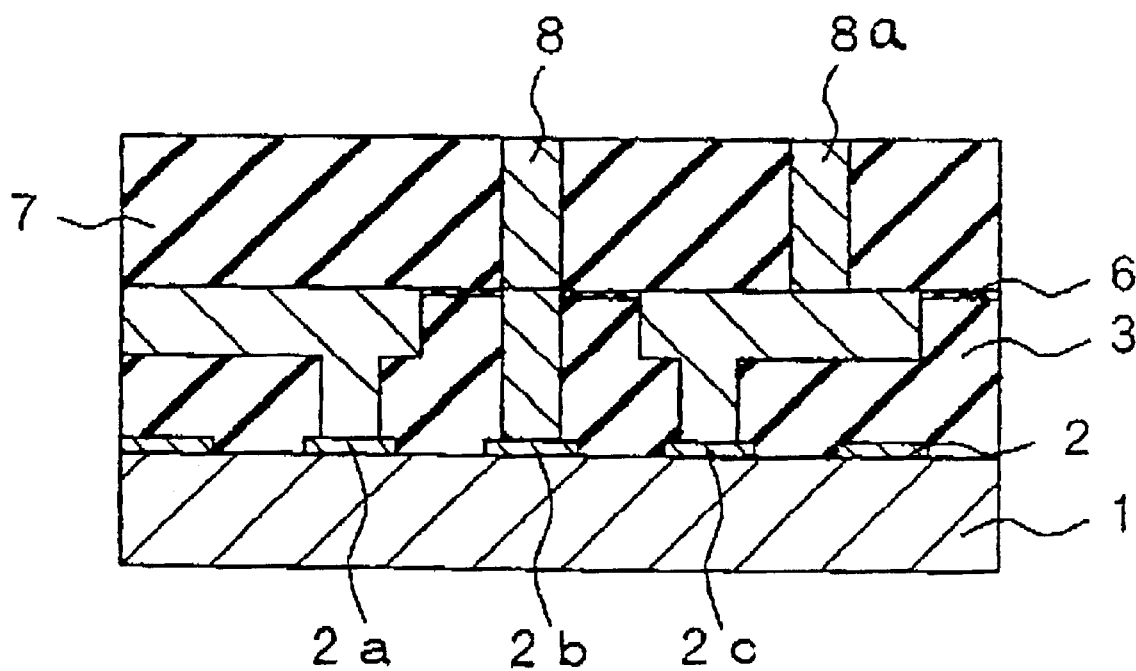

With reference to FIG. 4G, a second barrier metal layer is entirely deposited by a sputtering method or a chemical vapor deposition method on the top surface of the second level inter-layer insulator 7, side walls of the first and second second-level contact holes 15 and 15a and the top of the first first-level contact plug 4 as well as on the part of the top of the second level interconnection 5. The second barrier metal layer may comprise a titanium nitride layer. A second conductive layer is further entirely deposited by a sputtering method or a chemical vapor deposition method on the second barrier metal layer, so that the second conductive layer completely fills the first and second second-level contact holes 15 and 15a and also extends over the top surface of the second level inter-layer insulator 7. The second conductive layer may comprise a tungsten layer. Laminations of the second barrier metal layer and the second conductive layer are then etched back, so that the laminations of the second barrier metal layer and the second conductive layer remain only within the first and second second-level contact holes 15 and 15a, whereby a first second-level contact plug 8 is formed within the first second-level contact hole 15 and a second second-level contact plug 8a is formed within the second second-level contact hole 15a. The first second-level contact plug 8 penetrates the second level inter-layer insulator 7 and reaches the top of the first first-level contact plug 4, wherein the first second-level contact plug 8 in the second level inter-layer insulator 7 is just aligned to the first first-level contact plug 4 in the first level inter-layer insulator 3. The first second-level contact plug 8 is connected through the first first-level contact plug 4 to the first level interconnection 2b. The second second-level contact plug 8a penetrates the second level inter-layer insulator 7 and reaches a part of the top surface of the second level interconnection 5. The second second-level contact plug 8a is connected through the second level interconnection 5 and the second first-level contact plug 4a to the first level interconnection 2c. The above etch-back process causes that not only the second conductive layer but also the second level inter-layer insulator 7 are etched back thereby to form a planarized surface. Namely, the top of the first second-level contact plug 8 is leveled to the top surface of the second level inter-layer insulator 7. The top of the second second-level contact plug 8a is also leveled to the top surface of the second level inter-layer insulator 7. The first second-level contact plug 8 and the second second-level contact plug 8a have the same top level as each other and also as the second level inter-layer insulator 7. The tops of the first second-level contact plug 8 and the second second-level contact plug 8a and the top surface of the second level inter-layer insulator 7 form a planarized surface. The first and second second-level contact plugs 8 and 8a have the same depth or height as each other.

Figure 4H:
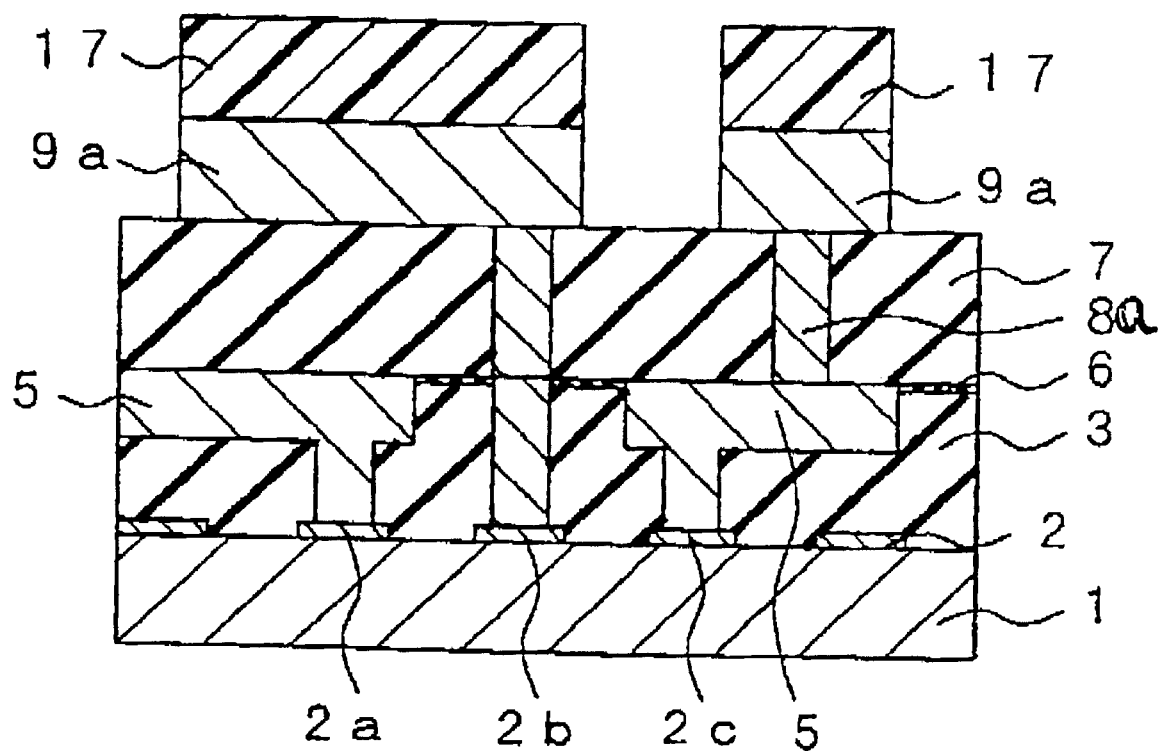

With reference to FIG. 4H, a third barrier metal layer is entirely deposited by a sputtering method or a chemical vapor deposition method on the planarized surface, so that the third barrier metal layer extends over the top surface of the second level inter-layer insulator 7 and the tops of the first and second second-level contact plugs 8 and 8a. The third barrier metal layer may comprise a titanium nitride layer. A third conductive layer is further deposited on the third barrier metal layer by a sputtering method or a chemical vapor deposition method to form a third conductive layered structure 9a which comprises laminations of the third barrier metal layer and the third conductive layer. The third conductive layer may comprise an aluminum alloy layer. The third conductive layered structure 9a may have a thickness of 350 nanometers. A fourth resist film is entirely applied on the top surface of the third conductive layered structure 9a. The fourth resist film is then patterned by a lithography technique to form a fourth resist pattern 17 over the top surface of the third conductive layered structure 9a. An anisotropic etching process is carried out by use of the fourth resist pattern 17 as a mask for selectively etching the third conductive layered structure 9a until parts of the top surface of the second level inter-layer insulator 7 are shown, whereby first and second third-level interconnections 9 and 9a are formed on the planarized surface, so that the first and second third-level interconnections 9 and 9a extend over the second level inter-layer insulator 7 and over the first second-level contact plug 8 and the second second-level contact plug 8a. The first third-level interconnection 9 is in contact with the top of the first second-level contact plug 8, whereby the first third-level interconnection 9 is connected through the first second-level contact plug 8, the first first-level contact plug 4 to the first level interconnection 2b. The second third-level interconnection 9a is in contact with the second second-level contact plug 8a, whereby the second third-level interconnection 9a is connected through the second second-level contact plug 8a, the second level interconnection 5 and the second first-level contact plug 4a to the first level interconnection 2c.

Figure 4I:
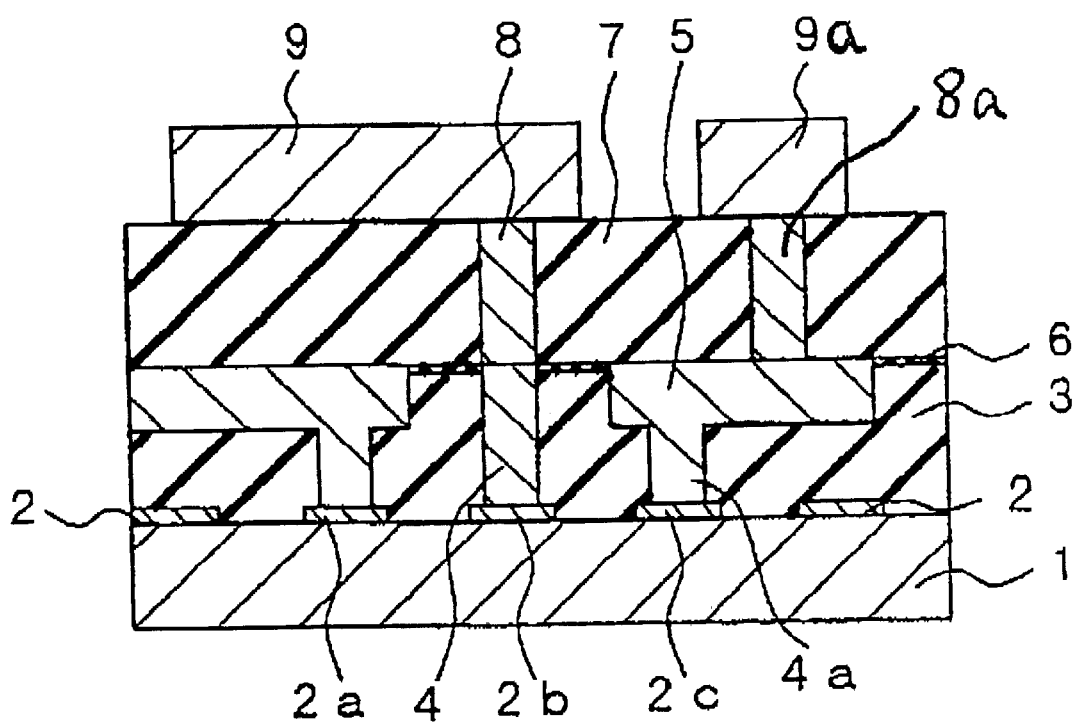

With reference to FIG. 4I, the used fourth resist pattern 17 is removed. As a result, the first novel multilevel interconnection structure of the semiconductor integrated circuit is completed. As described above, the first first-level contact plug 4 and the second level interconnection 5 both formed in the first level inter-layer insulator structure have the same top level as each other, whereby the first and second second-level contact plugs 8 and 8a in the second level inter-layer insulator 7 have the same depth or height as each other. This makes it possible that the first second-level contact plug 8 and the first first-level contact plug 4 are connected directly with each other without intervening any interconnection pad in the mid-level, for example, the second level interconnection 5. This results in a certain reduction in the necessary number of the second level interconnections 5. Namely, the number of the interconnection pattern of the second level interconnections 5 is reduced. This contributes to increase the density of integration of the semiconductor integrated circuit having the multilevel interconnection structure.

The first first-level contact plug 4 is deeper than the second first-level contact plugs 4a by the thickness of the second level interconnections 5. The depth of the first first-level contact plug 4 is substantially the same as the thickness of the first-level inter-layer insulator 3. Generally, in accordance with the multilevel interconnection structure, however, the higher level interconnection has a larger thickness than the lower level interconnection. As far as the inter-layer insulators are completely planarized, the higher level inter-layer insulator is thicker than the lower level inter-layer insulator. Even the depth of the first first-level contact plug 4 is substantially the same as the thickness of the first-level inter-layer insulator 3, the thickness of the first-level inter-layer insulator 3 is not so large, for which reason the depth of the first first-level contact plug 4 is not so large. Namely, the aspect ratio of the first first-level contact plug 4 is not so large. Therefore, the aspect ratio of the first first-level contact plug 4 is not serious problem nor substantive problem.

Furthermore, the top surface of the second level inter-layer insulator 7 is completely planarized. All of the first and second second-level contact plugs 8 and 8a are uniform in depth. This makes it possible to reduce the depth of the first and second second-level contact plugs 8 and 8a or reduce the thickness of the second level inter-layer insulator 7. This makes it possible to reduce the aspect ratio of the first and second second-level contact plugs 8 and 8a.

The first first-level contact plug 4, the second first-level contact plugs 4a and the second level interconnections 5 are formed in the same sequential processes of filling the conductive material and subsequent planarization, for example, the chemical mechanical polishing process. A set of the second first-level contact plug 4a and the second level interconnection 5 comprises the single unitary formed conductive layer, for which reason no misalignment nor displacement in alignment may be caused in each of the processes. It is unnecessary to carry out two separate patterning processes, for which reason the above multilevel interconnection structure is free from the problem with the misalignment in the lithography processes.

SECOND EMBODIMENT

Figure 5:
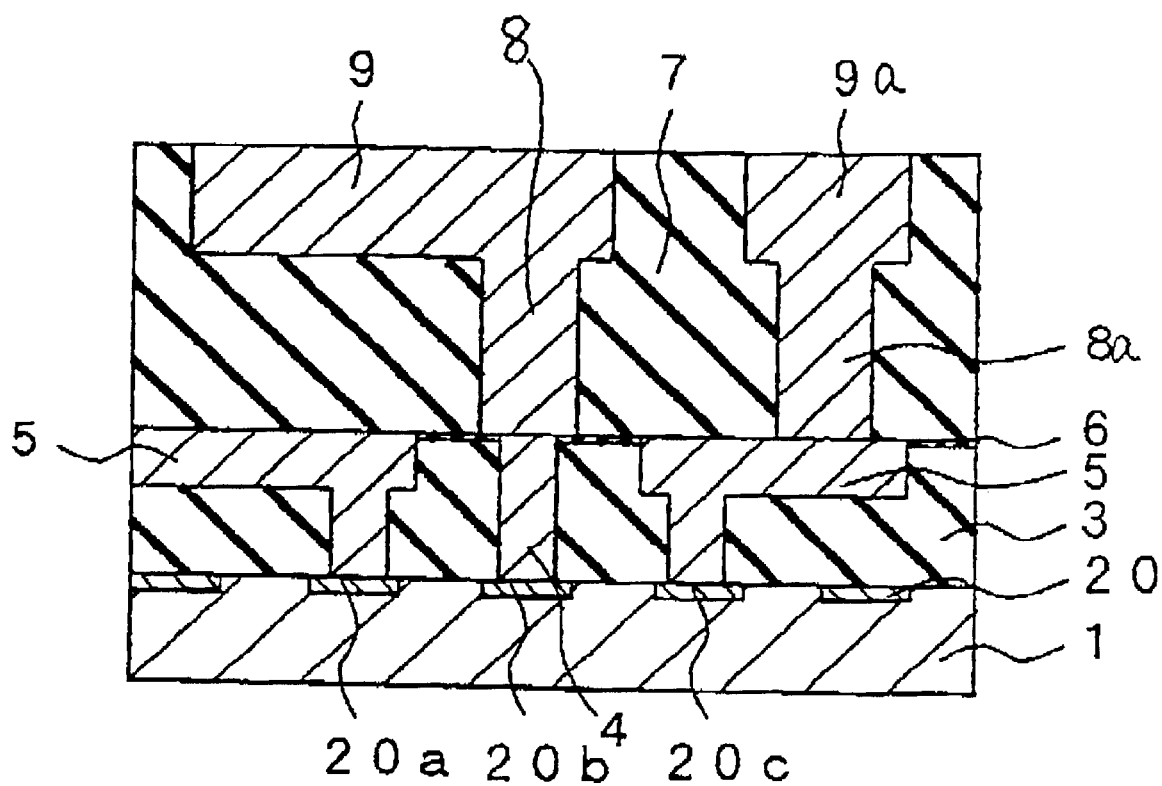
FIG. 5 is a second novel multilevel interconnection structure of a semiconductor integrated circuit in a second embodiment in accordance with the present invention.

A second embodiment according to the present invention will be described in detail with reference to the drawings. FIG. 5 is a second novel multilevel interconnection structure of a semiconductor integrated circuit in second embodiment in accordance with the present invention. A semiconductor substrate 1 is prepared which has an integration of plural semiconductor devices which include field effect transistors such as MOS field effect transistors. Impurity diffusion layers 20 as a first level conductive layer and serving as source and drain regions of the MOS field effect transistors are selectively provided in upper regions of the semiconductor substrate 1. A first level inter-layer insulator 3 is entirely provided which extends over the impurity diffusion layers 20 and the top surface of the semiconductor substrate 1, whereby the impurity diffusion layers 20 and the top surface of the semiconductor substrate 1 are completely covered by the first level inter-layer insulator 3. A stopper film 6 is provided which extends over the top surface of the first level inter-layer insulator 3. A first first-level contact hole is provided in the first level inter-layer insulator 3 and the stopper film 6, so that the first first-level contact hole penetrates the first level inter-layer insulator 3 and the stopper film 6 and reaches a part of the top surface of the impurity diffusion layer 20b as one of the plural impurity diffusion layers 20. A first first-level contact plug 4 is provided within the first first-level contact hole, so that the first first-level contact plug 4 penetrates the first level inter-layer insulator 3 and the stopper film 6 and reaches a part of the top surface of the impurity diffusion layer 20b as one of the plural impurity diffusion layers 20, whereby the first first-level contact plug 4 is connected with the impurity diffusion layer 20b. Second first-level contact holes are provided which penetrate the first level inter-layer insulator 3 and reach parts of the top surfaces of the impurity diffusion layers 20a and 20c as others of the plural impurity diffusion layers 20. Second level interconnection grooves are selectively provided in an upper region of the first level inter-layer insulator 3, so that the second level interconnection grooves are connected with the second first-level contact holes. Second first-level contact plugs 4a are provided within the second first-level contact holes, so that the second first-level contact plugs 4a reach parts of the top surfaces of the impurity diffusion layers 20a and 20c as others of the plural impurity diffusion layers 20, whereby the second first-level contact plugs 4a are connected with the impurity diffusion layers 20a and 20c as others of the plural impurity diffusion layers 20. Second level interconnections 5 as a second conductive layer are provided which extend in the second level interconnection grooves, so that the second level interconnections 5 are connected through the second first-level contact plugs 4a to the impurity diffusion layers 20a and 20c as others of the plural impurity diffusion layers 20. A set of the second first-level contact plugs 4a and the second level interconnections 5 comprises a single conductive united structure which extends within the second first-level contact hole and the second level interconnection groove. Namely, the second first-level contact plug 4a comprises a part of the single conductive united structure extending in the second first-level contact hole, whilst the second level interconnection 5 comprises the remaining part of the single conductive united structure extending in the second level interconnection groove. The top of the first first-level contact plug 4 is leveled to the top surface of the stopper insulating layer 6 over the first level inter-layer insulator 3. Assuming that the laminations of the stopper insulating layer 6 and the first level inter-layer insulator 3 form a first level inter-layer insulator structure, then the top of the first first-level contact plug 4 is leveled to the top surface of the first level inter-layer insulator structure. The top of the second level interconnection 5 is leveled to the top surface of the stopper insulating layer 6 over the first level inter-layer insulator 3. Assuming that the laminations of the stopper insulating layer 6 and the first level inter-layer insulator 3 form the first level inter-layer insulator structure, then the top of the second level interconnection 5 is leveled to the top surface of the first level inter-layer insulator structure. Also, the second level interconnection 5 has the same top level as the first first-level contact plug 4. In summary, the tops of the second level interconnections 5, the first first-level contact plug 4 and the first level inter-layer insulator structure are leveled or planarized to form a planarized surface. A second level inter-layer insulator 7 is entirely provided on the planarized surface, so that the second level inter-layer insulator 7 extends over the tops of the second level interconnections 5, the first first-level contact plug 4 and the first level inter-layer insulator structure or the stopper insulating layer 6. A first second-level contact hole is provided in the second level inter-layer insulator 7, so that the first second-level contact hole is positioned over and just aligned to the first first-level contact plug 4. Second second-level contact holes are provided in the second level inter-layer insulator 7 and reach the top of the first first-level contact plug 4 and a part of the top surface of the second level interconnection 5. Second level interconnection grooves are selectively provided in an upper region of the second level inter-layer insulator 7, so that the second level interconnection grooves are connected with the first and second first-level contact holes. A first second-level contact plug 8 is provided within the first second-level contact hole, so that the first second-level contact plug 8 reaches the top of the first first-level contact plug 4, wherein the first second-level contact plug 8 in the second level inter-layer insulator 7 is just aligned to the first first-level contact plug 4 in the first level inter-layer insulator 3. The first second-level contact plug 8 is connected through the first first-level contact plug 4 to the impurity diffusion layer 20*b*. A second second-level contact plug 8*a* is provided within the second second-level contact hole, so that the second second-level contact plug 8*a* reaches a part of the top surface of the second level interconnection 5. The second second-level contact plug 8*a* is connected through the second level interconnection 5 and the second first-level contact plug 4*a* to the impurity diffusion layer 20*c*. The first and second second-level contact plugs 8 and 8*a* have the same depth or height as each other. First and second third-level interconnections 9 and 9*a* are provided in the third-level interconnection grooves formed in selected upper regions of the second-level inter-layer insulator 7, so that the first and second third-level interconnections 9 and 9*a* extend over the first second-level contact plug 8 and the second second-level contact plug 8*a* respectively. The first third-level interconnection 9 is in contact with the top of the first second-level contact plug 8, whereby the first third-level interconnection 9 is connected through the first second-level contact plug 8, the first first-level contact plug 4 to the impurity diffusion layer 20*b*. The second third-level interconnection 9*a* is in contact with the second second-level contact plug 8*a*, whereby the second third-level interconnection 9*a* is connected through the second second-level contact plug 8*a*, the second level interconnection 5 and the second first-level contact plug 4*a* to the impurity diffusion layer 20*c*. The top surface of the first third-level interconnection 9 is leveled to the top surface of the second-level inter-layer insulator 7. The top surface of the second third-level interconnection 9*a* is also leveled to the top surface of the second-level inter-layer insulator 7. The first and second third-level interconnections 9 and 9*a* have the same top level as each other, and also as the second-level inter-layer insulator 7. The top surfaces of the first and second third-level interconnections 9 and 9*a* and the second-level inter-layer insulator 7 have a planarized surface. Further, the first second-level contact plug 8 is larger in diameter than the first second-level contact plug 4. A set of the first second-level contact plug 8 and the first third-level interconnection 9 comprises a second-level single conductive united structure which extends within the first second-level contact hole and the third level interconnection groove. Namely, the first second-level contact plug 8 comprises a part of the second-level single conductive united structure extending in the first second-level contact hole, whilst the first third-level interconnection 9 comprises the remaining part of the second-level single conductive united structure extending in the third-level interconnection groove.

As described above, the first first-level contact plug 4 and the second level interconnection 5 provided in the first level inter-layer insulator structure have the same top level as each other, whereby the first and second second-level contact plugs 8 and 8*a* in the second level inter-layer insulator 7 have the same depth or height as each other. This makes it possible that the first second-level contact plug 8 and the first first-level contact plug 4 are connected directly with each other without intervening any interconnection pad in the mid-level, for example, the second level interconnection 5. This results in a certain reduction in the necessary number of the second level interconnections 5. Namely, the number of the interconnection pattern of the second level interconnections 5 is reduced. This contributes to increase the density of integration of the semiconductor integrated circuit having the multilevel interconnection structure.

The first first-level contact plug 4 is deeper than the second first-level contact plugs 4*a* by the thickness of the second level interconnections 5. The depth of the first first-level contact plug 4 is substantially the same as the thickness of the first-level inter-layer insulator 3. Generally, in accordance with the multilevel interconnection structure, however, the higher level interconnection has a larger thickness than the lower level interconnection. As far as the inter-layer insulators are completely planarized, the higher level inter-layer insulator is thicker than the lower level inter-layer insulator. Even the depth of the first first-level contact plug 4 is substantially the same as the thickness of the first-level inter-layer insulator 3, the thickness of the first-level inter-layer insulator 3 is not so large, for which reason the depth of the first first-level contact plug 4 is not so large. Namely, the aspect ratio of the first first-level contact plug 4 is not so large. Therefore, the aspect ratio of the first first-level contact plug 4 is not serious problem nor substantive problem.

Furthermore, the top surface of the second level inter-layer insulator 7 is completely planarized. All of the first and second second-level contact plugs 8 and 8*a* are uniform in depth. This makes it possible to reduce the depth of the first and second second-level contact plugs 8 and 8*a* or reduce the thickness of the second level inter-layer insulator 7. This makes it possible to reduce the aspect ratio of the first and second second-level contact plugs 8 and 8*a*.

Moreover, the first second-level contact plug 8 is larger in diameter than the first first-level contact plug 4. This makes it easy to form the first second-level contact hole in the second-level inter-layer insulator 7. This also makes it easy to fill the conductive material to the first second-level contact hole to form the first second-level contact plug 8 in the second-level inter-layer insulator 7. This further makes reduced the aspect ratio of the first second-level contact hole.

Still more, the first and second third level interconnections are formed in the upper regions of the second-level inter-layer insulator 7, for which reason the uniform depth of the first and second second-level contact plugs 8 and 8*a* is smaller than the thickness of the second-level inter-layer insulator 7. This further makes reduced the aspect ratio of the first second-level contact hole.

A second novel method of forming the above described second novel multilevel interconnection stricture of the semiconductor integrated circuit. FIGS. 6A through 6I are fragmentary cross sectional elevation views illustrative of a second novel method of forming the second novel multilevel interconnection structure of the semiconductor integrated circuit of FIG. 5 in the second embodiment in accordance with the present invention.

Figure 6A:
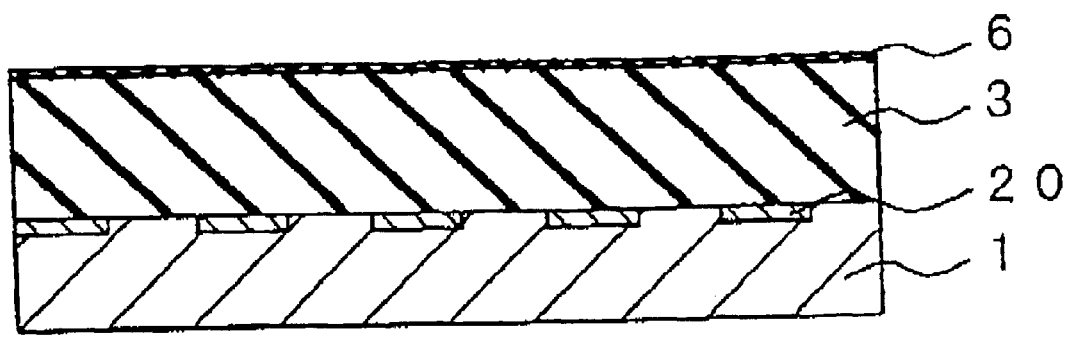
FIGS. 6A through 6I are fragmentary cross sectional elevation views illustrative of a second novel method of forming the second novel multilevel interconnection structure of the semiconductor integrated circuit of FIG. 5 in the second embodiment in accordance with the present invention.

With reference to FIG. 6A, a semiconductor substrate 1 is prepared which has an integration of plural semiconductor devices which include field effect transistors such as MOS field effect transistors. Impurity diffusion layers 20 as a first level conductive layer and partially serving as source and drain regions of the MOS field effect transistors are selectively formed which extend over a top surface of the semiconductor substrate 1. Each of the impurity diffusion layers 20 may comprise a polycrystalline silicon layer or alternatively may comprise a refractory metal suicide layer. Each of the impurity diffusion layers 20 may have a thickness of 150 nanometers. A first level inter-layer insulator 3 is entirely deposited which extends over the impurity diffusion layers 20 and the top surface of the semiconductor substrate 1, whereby the impurity diffusion layers 20 and the top surface of the semiconductor substrate 1 are completely covered by the first level inter-layer insulator 3. The top surface of the first level inter-layer insulator 3 is then planarized. The first level inter-layer insulator 3 may comprise a silicon dioxide film. The first level inter-layer insulator 3 may have a thickness of 250 nanometers. A stopper film 6 is formed which extends over the planarized top surface of the first level inter-layer insulator 3. The stopper film 6 may comprise a silicon nitride film. The stopper film 6 may have a thickness of 50 nanometers.

Figure 6B:
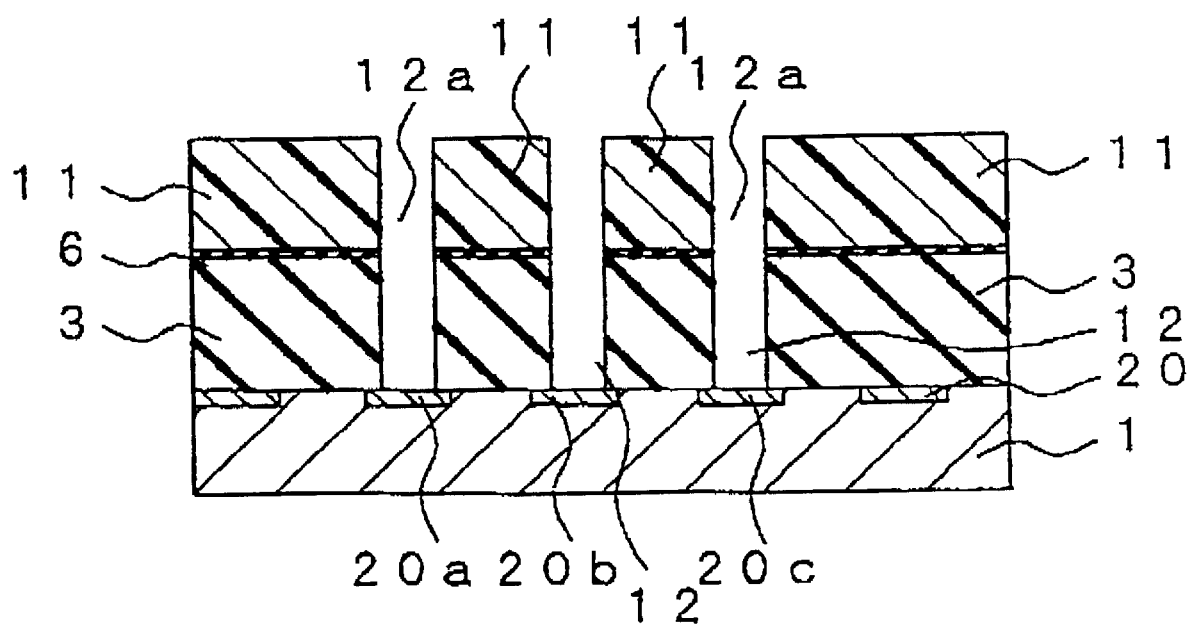

With reference to FIG. 6B, a first resist film is entirely formed on the top surface of the stopper film 6. The first resist film is then patterned by a lithography technique to form a first resist pattern 11 over the top surface of the stopper film 6. An anisotropic etching process is carried out by use of the first resist pattern 11 as a mask to selectively etch the stopper film 6 and the first level inter-layer insulator 3, in order to form a first first-level contact hole 12 and second first-level contact holes 12a. The first first-level contact hole 12 penetrates the first level inter-layer insulator 3 and reaches a part of the top surface of the impurity diffusion layer 20b as one of the plural impurity diffusion layers 20. The second first-level contact holes 12a also penetrate the first level inter-layer insulator 3 and reach parts of the top surfaces of the impurity diffusion layers 20a and 20b as others of the plural impurity diffusion layers 20. The first first-level contact hole 12 may have a diameter of 250 nanometers. The second first-level contact holes 12a may have a diameter of 250 nanometers. The used first resist pattern 11 is removed.

Figure 6C:
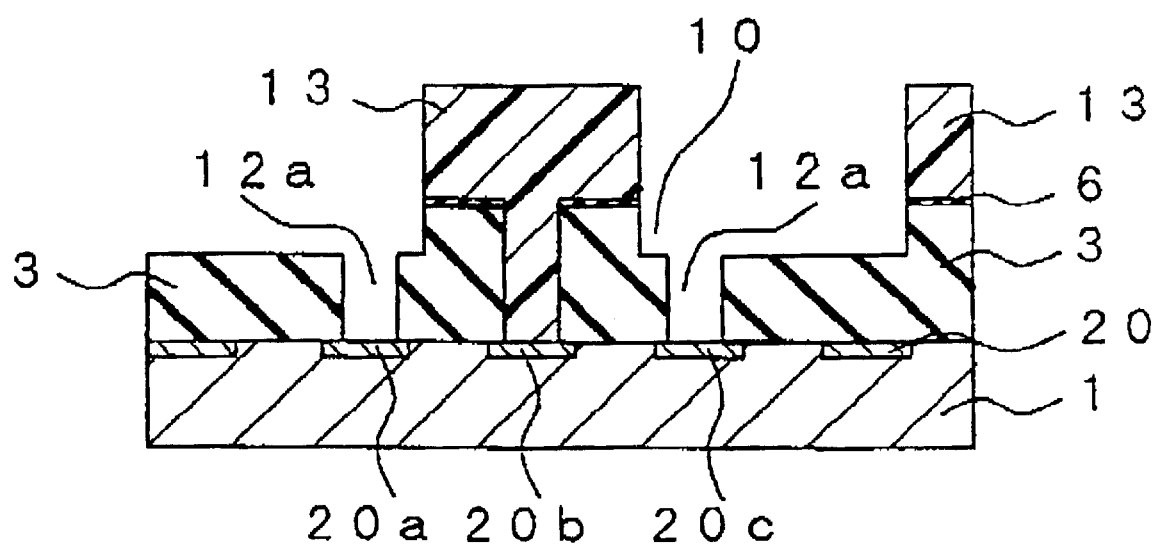

With reference to FIG. 6C, a second resist film is entirely applied on the top surface of the stopper film 6 and also on the bottoms and side walls of the first and second first-level contact holes 12 and 12a of the first level inter-layer insulator 3, so that the second resist film completely fills the first and second first-level contact holes 12 and 12a. The second resist film is then patterned by a lithography technique to form a second resist pattern 13 over the top surface of the stopper film 6 and within the first first-level contact hole 12 of the first level inter-layer insulator 3. An anisotropic etching process is carried out by use of the second resist pattern 13 as a mask to selectively etch the first level inter-layer insulator 3 and the stopper film 6 up to a predetermined depth from the top surface of the first level inter-layer insulator 3, in order to form first grooves 10 in selected upper regions of the first level inter-layer insulator 3. The predetermined depth may be 150 nanometers, so that the first grooves 10 has a depth of 150 nanometers. The used second resist pattern 13 is removed.

Figure 6D:
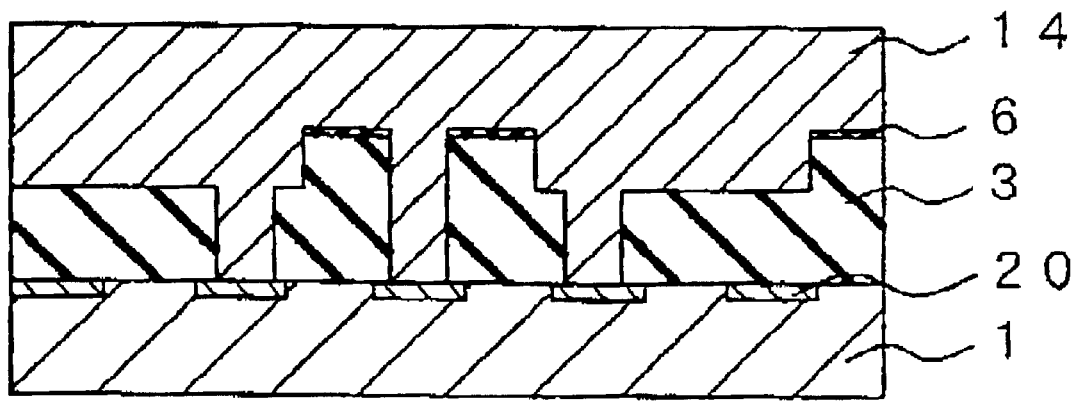

With reference to FIG. 6D, a first barrier metal layer is entirely deposited by a sputtering method or a chemical vapor deposition method on the top surface of the stopper insulating layer 6, the side walls and bottoms of the first grooves 10 of the first level inter-layer insulator 3 and the side walls of the first and second first-level contact holes 12 and 12a of the first level inter-layer insulator 3 as well as on the shown parts of the impurity diffusion layers 20a, 20b and 20c. The first barrier metal layer may comprise a titanium nitride film. A first conductive layer is also entirely deposited on the first barrier metal layer by a sputtering method or a chemical vapor deposition method, so that the first conductive layer completely fills the first and second first-level contact holes 12 and 12a and the first grooves 10 and further extends over the stopper insulating layer 6, so as to form a first conductive layer 14 which comprises laminations of the first barrier metal layer and the conductive layer. The first conductive layer may comprise a tungsten layer. The first conductive layer 14 is much higher in polishing rate than the stopper insulating layer 6.

Figure 6E:
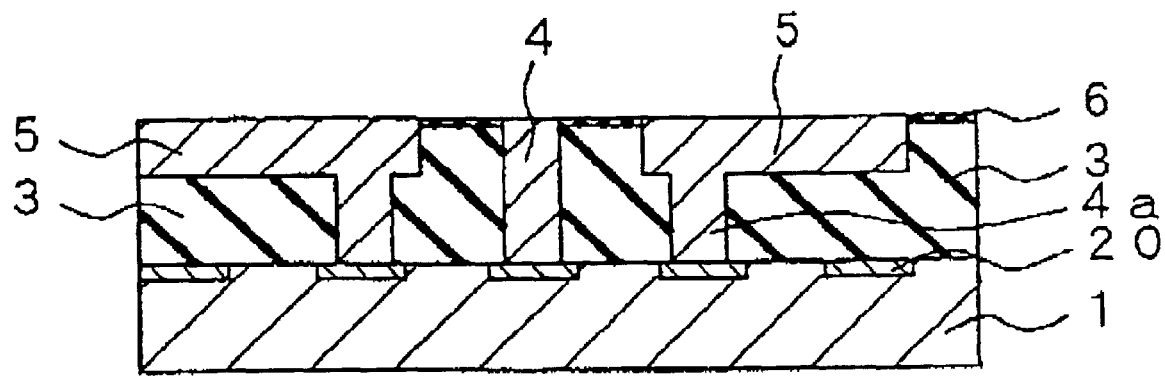

With reference to FIG. 6E, a planarization process, for example, a chemical mechanical polishing process is carried out for polishing the first conductive layer 14, wherein the stopper insulating layer 6 serves as a polishing stopper, so that the chemical mechanical polishing process to the first conductive layer 14 is stopped just when the top surface of the stopper insulating layer 6 is shown. The first conductive layer 14 remains within the first grooves 10 and the first and second first-level contact holes 12 and 12a. As a result, a first first-level contact plug 4 is formed within the first first-level contact hole 12, so that the first first-level contact plug 4 extends penetrating the first level inter-layer insulator 3 and the stopper film 6 and reaches the part of the top surface of the impurity diffusion layer 20b as one of the plural impurity diffusion layers 20, whereby the first first-level contact plug 4 is connected with the impurity diffusion layer 20b. Further, second first-level contact plugs 4a are formed within the second first-level contact holes 12a, so that the second first-level contact plugs 4a reach parts of the top surfaces of the impurity diffusion layers 20a and 20c as others of the plural impurity diffusion layers 20, whereby the second first-level contact plugs 4a are connected with the impurity diffusion layers 20a and 20c as others of the plural impurity diffusion layers 20. Furthermore, second level interconnections 5 as a second conductive layer are formed which extend in the first grooves 10, so that the second level interconnections 5 are connected through the second first-level contact plugs 4a to the impurity diffusion layers 20a and 20c as others of the plural impurity diffusion layers 20. A set of the second first-level contact plug 4a in the second first-level contact hole 12a and the second level interconnection 5 in the first groove 10 comprises one remaining part of the first conductive layer 14. Namely, a single conductive united structure comprising one remaining part of the first conductive layer 14 extends within the second first-level contact hole 12a and the first groove 10. Namely, the second first-level contact plug 4a comprises a part of the single conductive united structure extending in the second first-level contact hole 12a, whilst the second level interconnection 5 comprises the remaining part of the single conductive united structure extending in the first groove 10. The top of the first first-level contact plug 4 is leveled to the top surface of the stopper insulating layer 6 over the first level inter-layer insulator 3. Assuming that the laminations of the stopper insulating layer 6 and the first level inter-layer insulator 3 form the first level inter-layer insulator structure, then the top of the first first-level contact plug 4 is leveled to the top surface of the first level inter-layer insulator structure. The top of the second level interconnection 5 is also leveled to the top surface of the stopper insulating layer 6 over the first level inter-layer insulator 3. Assuming that the laminations of the stopper insulating layer 6 and the first level inter-layer insulator 3 form the first level inter-layer insulator structure, then the top of the second level interconnection 5 is leveled to the top surface of the first level inter-layer insulator structure. Also, the second level interconnection 5 has the same top level as the first first-level contact plug 4. In summary, the tops of the second level interconnections 5, the first first-level contact plug 4 and the first level inter-layer insulator structure are leveled or planarized to form a planarized surface. This process is different from the dual damascene method in that the second level interconnections 5 do not extend over the first first-level contact plug 4.

Figure 6F:
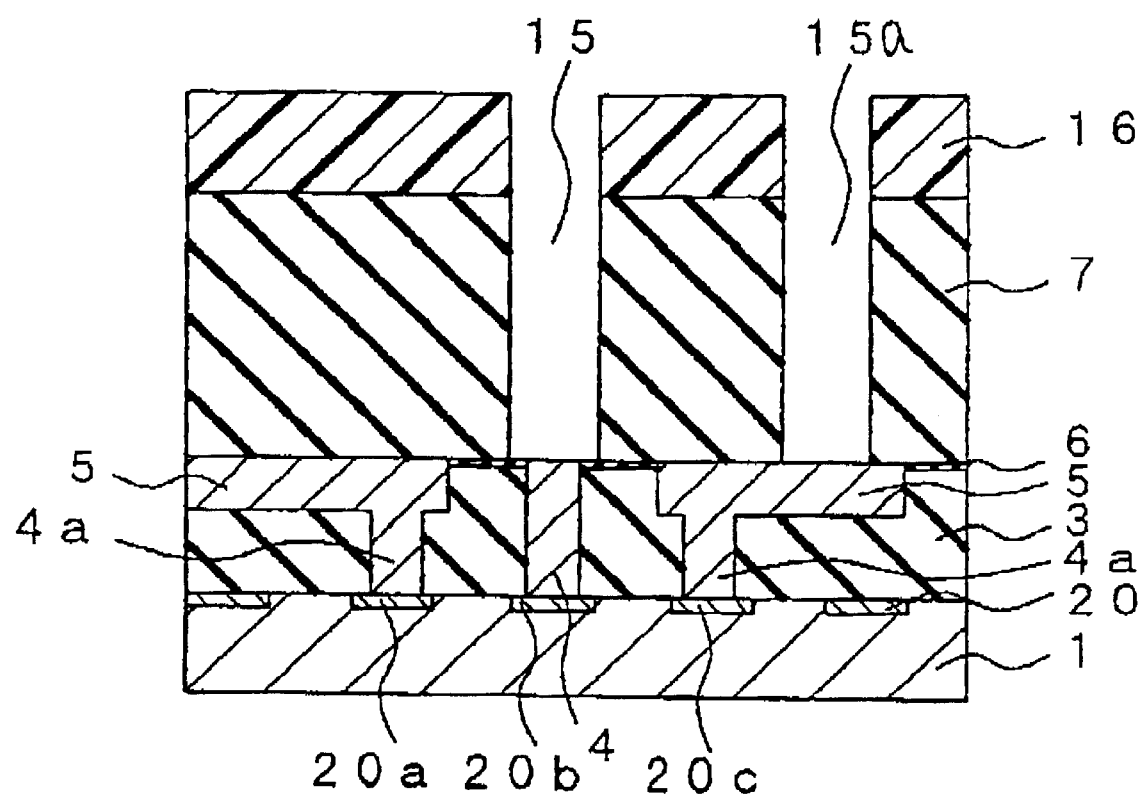

With reference to FIG. 6F, a second level inter-layer insulator 7 is entirely formed on the planarized surface, so that the second level inter-layer insulator 7 extends over the tops of the second level interconnections 5, the first first-level contact plug 4 and the first level inter-layer insulator structure or the stopper insulating layer 6. The second level inter-layer insulator 7 may comprise a silicon dioxide layer. The second level inter-layer insulator 7 may have a thickness of 750 nanometers. It is unnecessary to planarize the second level inter-layer insulator 7. A third resist film is entirely applied on the top surface of the second level inter-layer insulator 7. The third resist film is then patterned by a lithography technique to form a third resist pattern 16 over the second level inter-layer insulator 7. An anisotropic etching process is carried out by use of the third resist pattern 16 as a mask for selectively etching the second level inter-layer insulator 7 so as to form first and second second-level contact holes 15 and 15a in the second level inter-layer insulator 7. The first second-level contact hole 15 reaches the top of the first first-level contact plug 4, so that the first second-level contact hole 15 is positioned over and just aligned to the first first-level contact plug 4. The top of the first first-level contact plug 4 is shown through the first second-level contact hole 15. The second second-level contact hole 15a reaches a part of the top of the second level interconnection 5, so that the second second-level contact hole 15a is positioned over the second level interconnection 5. The part of the top of the second level interconnection 5 is shown through the second second-level contact hole 15a. The first second-level contact hole 15 may have a diameter of 400 nanometers, so that the diameter of the first second-level contact hole 15 is larger than the diameter of the first first-level contact plug 4. The second second-level contact hole 15a may also have a diameter of 400 nanometers, so that the diameter of the second second-level contact hole 15a is larger than the diameter of the first first-level contact plug 4. The used third resist pattern 16 is then removed.

Figure 6G:
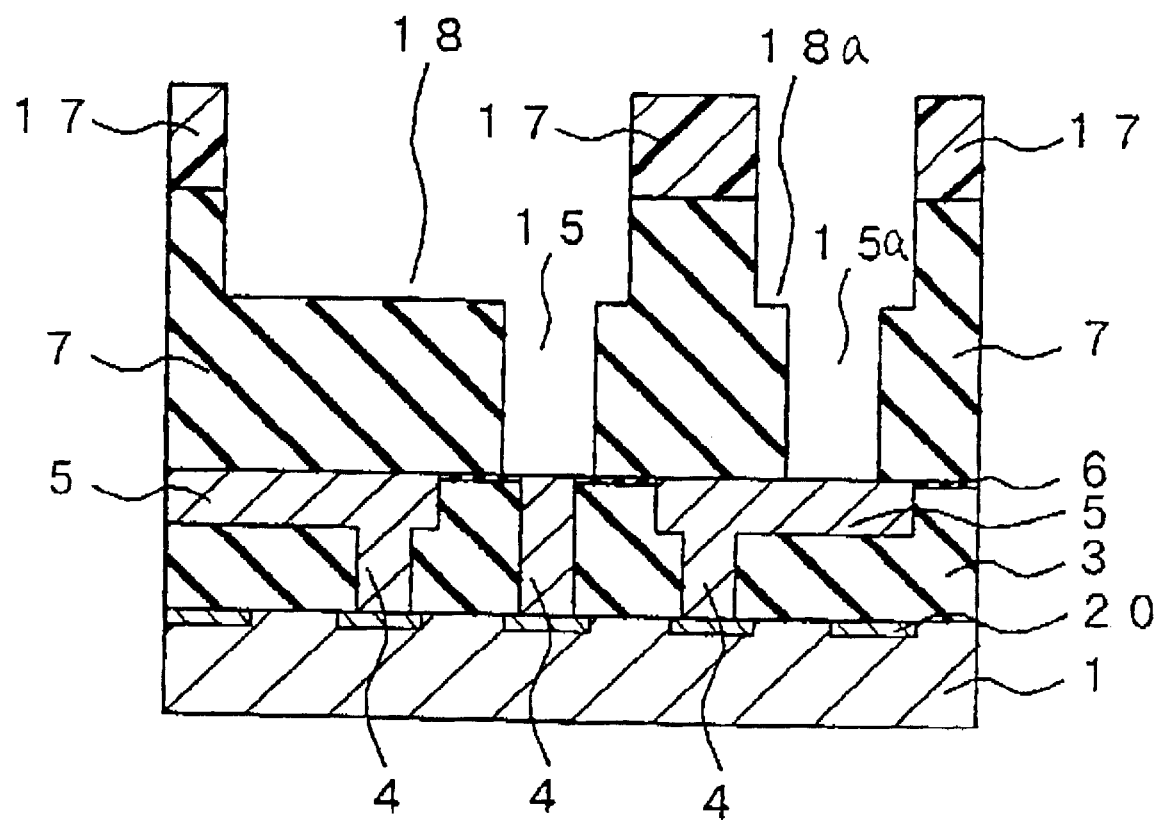

With reference to FIG. 6G, a fourth resist film is entirely applied on the top surface of the second level inter-layer insulator 7 and within the first and second second-level contact holes 15 and 15a. The fourth resist film is then patterned by a lithography technique to form a fourth resist pattern 17 over the second level inter-layer insulator 7. An anisotropic etching process is carried out by use of the fourth resist pattern 17 as a mask for selectively etching the second level inter-layer insulator 7 so as to form first and second second-level grooves 18 and 18a in the selected upper regions of the second level inter-layer insulator 7. The first second-level groove 18 is connected with the first second-level contact hole 15. The second second-level groove 18a is connected with the second second-level contact hole 15a. The used fourth resist pattern 17 is then removed.

Figure 6H:
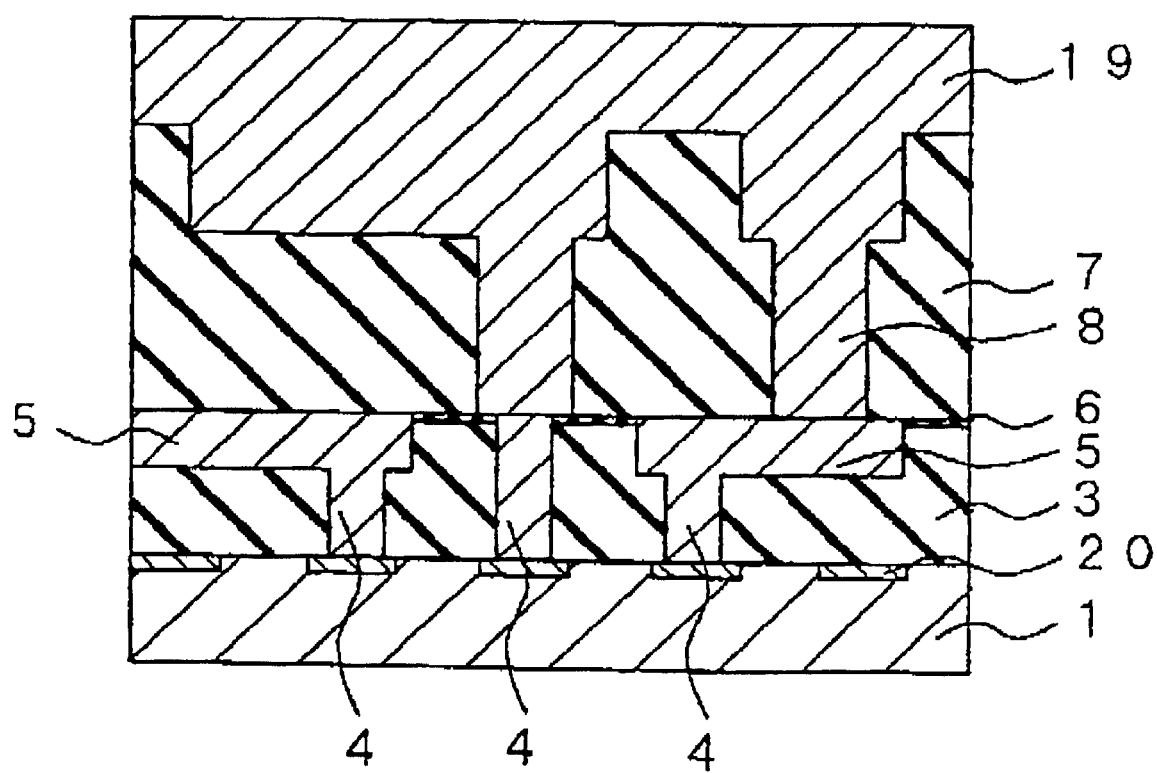

With reference to FIG. 6H, a second barrier metal layer is entirely deposited by a sputtering method or a chemical vapor deposition method or a plating method on the top surface of the second level inter-layer insulator 7, the side walls and bottoms of the first and second second-level grooves 18 and 18a of the second level inter-layer insulator 7 and the side walls and bottoms of the first and second second-level contact holes 15 and 15a of the second level inter-layer insulator 7. The second barrier metal layer may comprise a titanium nitride film. A second conductive layer is also entirely deposited on the second barrier metal layer by a sputtering method or a chemical vapor deposition method or a plating method, so that the second conductive layer completely fills the first and second second-level contact holes 15 and 15a and the first and second second-level grooves 18 and 18a and further extends over the second level inter-layer insulator 7, so as to form a second conductive layer 19 which comprises laminations of the second barrier metal layer and the second conductive layer. The second conductive layer may comprise a tungsten layer.

Figure 6I:
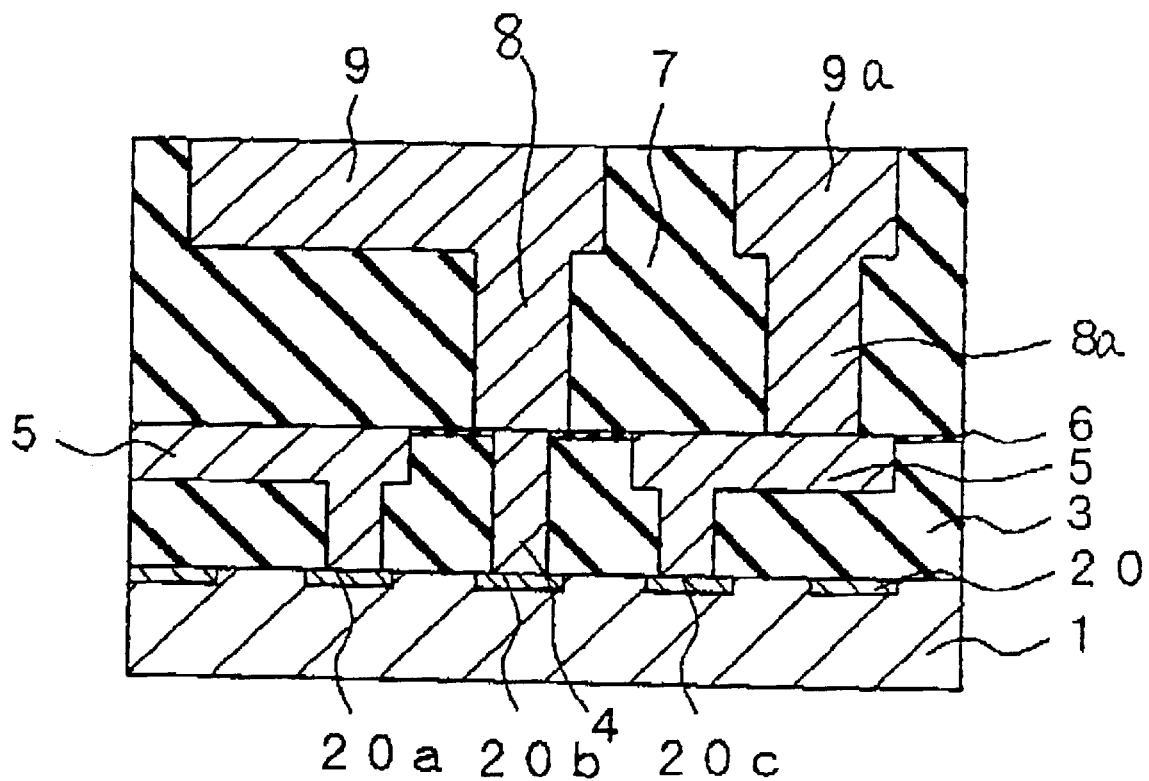

With reference to FIG. 6I, a planarization process, for example, a chemical mechanical polishing process is carried out for polishing the second conductive layer 19, wherein the top surface of the second level inter-layer insulator 7 is also planarized by the planarization process, for example, the chemical mechanical polishing process. The second conductive layer 19 remains within the first and second second-level grooves 18 and 18a and the first and second second-level contact holes 15 and 15a. As a result, a first second-level contact plug 8 is formed within the first second-level contact hole 15., so that the first second-level contact plug 8 reaches the top of the first first-level contact plug 4, whereby the first second-level contact plug 8 is connected through the first first-level contact plug 4 to the impurity diffusion layer 20b. Further, a second second-level contact plug 8a is formed within the second second-level contact holes 15a, so that the second second-level contact plug 8a reaches a part of the top surface of the second level interconnection 5, whereby the second second-level contact plug 8a is connected through the second level interconnection 5 and the second first-level contact plug 4a to the impurity diffusion layer 20c. Furthermore, a first third-level interconnection 9 is formed which extends in the first second-level groove 18, so that the first third-level interconnection 9 is connected through the first second-level contact plug 8 and the first first-level contact plug 4 to the impurity diffusion layers 20b. A second third-level interconnection 9a is formed which extends in the second second-level groove 18a, so that the second third-level interconnection 9a is connected through the second second-level contact plug 8a and the second first-level contact plug 4a to the impurity diffusion layers 20c. A set of the first second-level contact plug 8 in the first second-level contact hole 15 and the first second-level interconnection 9 in the first second-level groove 18 comprises one remaining part of the second conductive layer 19. Namely, a second-level single conductive united structure comprising one remaining part of the second conductive layer 19 extends within the first second-level contact hole 15 and the first second-level groove 18. Namely, the first second-level contact plug 8 comprises a part of the second-level single conductive united structure extending in the first second-level contact hole 15, whilst the first second-level interconnection 9 comprises the remaining part of the second-level single conductive united structure extending in the first second-level groove 18. A set of the second second-level contact plug 8a in the second second-level contact hole 15a and the second second-level interconnection 9a in the second second-level groove 18a comprises another remaining part of the second conductive layer 19. Namely, a second-level single conductive united structure comprising another remaining part of the second conductive layer 19 extends within the second second-level contact hole 15a and the second second-level groove 18a. Namely, the second second-level contact plug 8a comprises a part of the second-level single conductive united structure extending in the second second-level contact hole 15a, whilst the second second-level interconnection 9a comprises the remaining part of the second-level single conductive united structure extending in the second second-level groove 18a. The top surface of the first third-level interconnection 9 is leveled to the top surface of the second-level inter-layer insulator 7. The top surface of the second third-level interconnection 9a is also leveled to the top surface of the second-level inter-layer insulator 7. The first and second third-level interconnections 9 and 9a have the same top level as each other, and also as the second-level inter-layer insulator 7. The top surfaces of the first and second third-level interconnections 9 and 9a and the second-level inter-layer insulator 7 have a planarized surface. This process is different from the dual damascene method in that the second level interconnections 5 do not extend over the first first-level contact plug 4.

As a result, the second novel multilevel interconnection structure of the semiconductor integrated circuit is completed. As described above, the first first-level contact plug 4 and the second level interconnection 5 both formed in the first level inter-layer insulator structure have the same top level as each other, whereby the first and second second-level contact plugs 8 and 8a in the second level inter-layer insulator 7 have the same depth or height as each other. This makes it possible that the first second-level contact plug 8 and the first first-level contact plug 4 are connected directly with each other without intervening any interconnection pad in the mid-level, for example, the second level interconnection 5. This results in a certain reduction in the necessary number of the second level interconnections 5. Namely, the number of the interconnection pattern of the second level interconnections 5 is reduced. This contributes to increase the density of integration of the semiconductor integrated circuit having the multilevel interconnection structure.

The first first-level contact plug 4 is deeper than the second first-level contact plugs 4a by the thickness of the second level interconnections 5. The depth of the first first-level contact plug 4 is substantially the same as the thickness of the first-level inter-layer insulator 3. Generally, in accordance with the multilevel interconnection structure, however, the higher level interconnection has a larger thickness than the lower level interconnection. As far as the inter-layer insulators are completely planarized, the higher level inter-layer insulator is thicker than the lower level inter-layer insulator. Even the depth of the first first-level contact plug 4 is substantially the same as the thickness of the first-level inter-layer insulator 3, the thickness of the first-level inter-layer insulator 3 is not so large, for which reason the depth of the first first-level contact plug 4 is not so large. Namely, the aspect ratio of the first first-level contact plug 4 is not so large. Therefore, the aspect ratio of the first first-level contact plug 4 is not serious problem nor substantive problem.

Furthermore, the top surface of the second level inter-layer insulator 7 is completely planarized. All of the first and second second-level contact plugs 8 and 8a are uniform in depth. This makes it possible to reduce the depth of the first and second second-level contact plugs 8 and 8a or reduce the thickness of the second level inter-layer insulator 7. This makes it possible to reduce the aspect ratio of the first and second second-level contact plugs 8 and 8a.

The first first-level contact plug 4, the second first-level contact plugs 4a and the second level interconnections 5 are formed in the same sequential processes of filling the conductive material and subsequent planarization, for example, the chemical mechanical polishing process. A set of the second first-level contact plug 4a and the second level interconnection 5 comprises the single unitary formed conductive layer, for which reason no misalignment nor displacement in alignment may be caused in each of the processes. It is unnecessary to carry out two separate patterning processes, for which reason the above multilevel interconnection structure is free from the problem with the misalignment in the lithography processes.

Moreover, the first second-level contact plug 8 is larger in diameter than the first first-level contact plug 4. This makes it easy to form the first second-level contact hole in the second-level inter-layer insulator 7. This also makes it easy to fill the conductive material to the first second-level contact hole to form the first second-level contact plug 8 in the second-level inter-layer insulator 7. This further makes reduced the aspect ratio of the first second-level contact hole.

Still more, the first and second third level interconnections are formed in the upper regions of the second-level inter-layer insulator 7, for which reason the uniform depth of the first and second second-level contact plugs 8 and 8a is smaller than the thickness of the second-level inter-layer insulator 7. This further makes reduced the aspect ratio of the first second-level contact hole.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A method of a multilevel interconnection structure, said method comprising the steps of:

forming a lower-level inter-layer insulator structure over a semiconductor substrate;

forming both at least a first lower-level contact hole penetrating said lower-level inter-layer insulator structure and at least a set of a second lower-level contact hole in said lower-level inter-layer insulator structure except in an upper region thereof and a first lower-level interconnection groove in said upper region thereof;

forming a lower level conductive layered structure which completely fills said first and second lower-level contact holes and said first lower-level interconnection groove and which also extends over a top surface of said lower-level inter-layer insulator structure; and selectively removing said lower level conductive layered structure so that said top surface of said lower-level inter-layer insulator structure is shown and also said lower level conductive layered structure remains only within said first and second lower-level contact holes and said first lower-level interconnection groove, whereby a first lower-level contact plug is formed in said lower-level contact hole, and a lower-level single conductive united structure is formed, which further comprises: a second lower-level contact plug extending in said second lower-level contact hole; and a first lower-level interconnection extending in said first lower-level interconnection groove, wherein a top surface of said first lower level interconnection is leveled to a top surface of said lower level inter-layer insulator structure and also leveled to said top of said first lower level contact plug to form a lower-level planarized surface.

2. The method as claimed in claim 1, wherein said lower level conductive layered structure is selectively removed by a chemical mechanical polishing method.

3. The method as claimed in claim 2, wherein said lower-level inter-layer insulator structure is formed by the steps of:
   forming a lower level inter-layer insulator on said semiconductor substrate; and
   forming a stopper insulating film on said lower level inter-layer insulator, so that said stopper insulating film serves as a polishing stopper in said chemical mechanical polishing method.

4. The method as claimed in claim 1, wherein said first and second lower-level contact holes are formed in a first lithography process before said first lower-level interconnection groove is formed in a second lithography process.

5. The method as claimed in claim 1, wherein said first lower-level interconnection groove is formed in a first lithography process before said first and second lower-level contact holes are formed in a second lithography process.

6. The method as claimed in claim 1, further comprising the steps of:
   forming a higher-level inter-layer insulator structure over said lower-level planarized surface
   forming both at least a first set of a first higher-level contact hole in said higher-level inter-layer insulator structure except in an upper region thereof and a first higher-level interconnection groove extending in said upper region thereof and being connected with a top of said first higher-level contact hole, and at least a second set of a second higher-level contact hole in said higher-level inter-layer insulator structure except in an upper region thereof and a second higher-level interconnection groove extending in said upper region thereof and being connected with a top of said second higher-level contact hole, wherein said first higher-level contact hole is positioned over and aligned to said first lower-level contact plug, whilst said second higher-level contact hole is positioned over a part of said top surface of said first lower-level interconnection;
   forming a higher level conductive layered structure which completely fills said first and second higher-level contact holes and said first and second higher-level interconnection grooves and which also extends over a top Surface of said higher-level inter-layer insulator structure; and
   selectively removing said higher level conductive layered structure so that said top surface of said higher-level inter-layer insulator structure is shown and also said higher level conductive layered structure remains only within said first and second higher-level contact holes and said first and second higher-level interconnection grooves,
   whereby a first higher-level single conductive united structure is formed, which further comprises: a first higher-level contact plug extending in said first higher-level contact hole and being in contact directly with said top of said first lower-level contact plug; and a first higher-level interconnection extending in said first higher-level interconnection groove,
   wherein a second higher-level single conductive united structure is formed, which further comprises a second higher-level contact plug extending in said second higher-level contact hole and being in contact directly with said part of said top surface of said first lower-level interconnection and a second higher-level interconnection extending in said first higher-level interconnection groove, and
   wherein a top surface of said first higher level interconnection is leveled to a top surface of said higher level inter-layer insulator structure and also leveled to a top surface of said second higher level interconnection to form a higher-level planarized surface.

7. The method as claimed in claim 6, wherein said higher level conductive layered structure is selectively removed by a chemical mechanical polishing method.

8. The method as claimed in claim 6, wherein said first and second high-level contact holes are formed in a third lithography process before said first and second higher-level interconnection grooves are formed in a fourth lithography process.

9. The method as claimed in claim 6, wherein said first and second higher-level interconnection grooves are formed in a third lithography process before said first and second lower-level contact holes are formed in a fourth lithography process.

10. The method as claimed in claim 1, further comprising the steps of:
    forming a higher-level inter-layer insulator structure over said lower-level planarized surface;
    forming both first and second higher-level contact holes penetrating said higher-level inter-layer insulator structure, wherein said first higher-level contact hole is positioned over and aligned to said first lower-level contact plug, whilst said second higher-level contact hole is positioned over a part of said top surface of said first lower-level interconnection;
    forming a higher level conductive layered structure which completely fills said first and second higher-level contact holes and which also extends over a top surface of said higher-level inter-layer insulator structure; and
    selectively removing said higher level conductive layered structure so that said top surface of said higher-level inter-layer insulator structure is shown and also said higher level conductive layered structure remains only within said first and second higher-level contact holes,
    whereby a first higher-level contact plug is formed in said first higher-level contact hole and is in contact directly with said top of said first lower-level contact plug,
    wherein a second higher-level contact plug is formed in said second higher-level contact hole and is in contact directly with said part of said top surface of said first lower-level interconnection, and
    wherein a top of said higher-level contact plug is leveled to a top surface of said higher level inter-layer insulator structure and also leveled to a top of said second higher-level contact plug to form a higher-level planarized surface.

11. The method as claimed in claim 10, wherein said higher level conductive layered structure is selectively removed by an etch-back method.

12. The method as claimed in claim 12, further comprising the steps of:
    forming first and second higher-level interconnections over said higher-level planarized surface, so that said first higher-level interconnection is connected with said first higher-level contact plug, and said second higher-level interconnection is connected with said second higher-level contact plug.

13. A method of a multilevel interconnection structure, said method comprising the steps of:
    forming a lower-level inter-layer insulator structure over a semiconductor substrate;
    forming both at least a first lower-level contact hole penetrating said lower-level inter-layer insulator structure and at least a set of a second lower-level contact hole in said lower-level inter-layer insulator structure except in an upper region thereof and a first lower-level interconnection groove in said upper region thereof;

forming a lower level conductive layered structure which completely fills said first and second lower-level contact holes and said first lower-level interconnection groove and which also extends over a top surface of said lower-level inter-layer insulator structure;

selectively removing said lower level conductive layered structure so that said top surface of said lower-level inter-layer insulator structure is shown and also said lower level conductive layered structure remains only within said first and second lower-level contact holes and said first lower-level interconnection groove, whereby a first lower-level contact plug is formed in said lower-level contact hole, and a lower-level single conductive united structure is formed, which further comprises: a second lower-level contact plug extending in said second lower-level contact hole; and a first lower-level interconnection extending in said first lower-level interconnection groove, wherein a top surface of said first lower level interconnection is leveled to a top surface of said lower level inter-layer insulator structure and also leveled to said top of said first lower level contact plug to form a lower-level planarized surface forming a higher-level inter-layer insulator structure over said lower-level planarized surface;

forming both at least a first set of a first higher-level contact hole in said higher-level inter-layer insulator structure except in an upper region thereof and a first higher-level interconnection groove extending in said upper region thereof and being connected with a top of said first higher-level contact hole, and at least a second set of a second higher-level contact hole in said higher-level inter-layer insulator structure except in an upper region thereof and a second higher-level interconnection groove extending in said tipper region thereof and being connected with a top of said second higher-level contact hole, wherein said first higher-level contact hole is positioned over and aligned to said first lower-level contact plug, whilst said second higher-level contact hole is positioned over a part of said top surface of said first lower-level interconnection;

forming a higher level conductive layered structure which completely fills said first and second higher-level contact holes and said first and second higher-level interconnection grooves and which also extends over a top surface of said higher-level inter-layer insulator structure; and selectively removing said higher level conductive layered structure so that said top surface of said higher-level inter-layer insulator structure is shown and also said higher level conductive layered structure remains only within said first and second higher-level contact holes and said first and second higher-level interconnection grooves, whereby a first higher-level single conductive united structure is formed, which further comprises: a first higher-level contact plug extending in said first higher-level contact hole and being in contact directly with said top of said first lower-level contact plug; and a first higher-level interconnection extending in said first higher-level interconnection groove, wherein a second higher-level single conductive united structure is formed, which further comprises: a second higher-level contact plug extending in said second higher-level contact hole and being in contact directly with said part of said top surface of said first lower-level interconnection; and a second higher-level interconnection extending in said first higher-level interconnection groove, and wherein a top surface of said first higher level interconnection is leveled to a top surface of said higher level inter-layer insulator structure and also leveled to a top surface of said second higher level interconnection to form a higher-level planarized surface.

14. The method as claimed in claim 13, wherein said lower level conductive layered structure is selectively removed by a chemical mechanical polishing method.

15. The method as claimed in claim 14, wherein said lower-level inter-layer insulator structure is formed by the steps of:

forming a lower level inter-layer insulator on said semiconductor substrate; and forming a stopper insulating film on said lower level inter-layer insulator, so that said stopper insulating film serves as a polishing stopper in said chemical mechanical polishing method.

16. The method as claimed in claim 13, wherein said first and second lower-level contact holes are formed in a first lithography process before said first lower-level interconnection groove is formed in a second lithography process.

17. The method as claimed in claim 13, wherein said first lower-level interconnection groove is formed in a first lithography process before said first and second lower-level contact holes are formed in a second lithography process.

18. The method as claimed in claim 13, wherein said higher level conductive layered structure is selectively removed by a chemical mechanical polishing method.

19. The method as claimed in claim 13, wherein said first and second high-level contact holes are formed in a third lithography process before said first and second higher-level interconnection grooves are formed in a fourth lithography process.

20. The method as claimed in claim 13, wherein said first and second higher-level interconnection grooves are formed in a third lithography process before said first and second lower-level contact holes are formed in a fourth lithography process.

21. A method of a multilevel interconnection structure, said method comprising the steps of:

forming a lower-level inter-layer insulator structure over a semiconductor substrate;

forming both at least a first lower-level contact hole penetrating said lower-level inter-layer insulator structure and at least a set of a second lower-level contact hole in said lower-level inter-layer insulator structure except in an upper region thereof and a first lower-level interconnection groove in said upper region thereof;

forming a lower level conductive layered structure which completely fills said first and second lower-level contact holes and said first lower-level interconnection groove and which also extends over a top surface of said lower-level inter-layer insulator structure;

selectively removing said lower level conductive layered structure so that said top surface of said lower-level inter-layer insulator structure is shown and also said lower level conductive layered structure remains only within said first and second lower-level contact holes and said first lower-level interconnection groove, whereby a first lower-level contact plug is formed in said lower-level contact hole, and a lower-level single conductive united structure is formed, which further comprises a second lower-level contact plug extending in said second lower-level contact hole; and a first lower-level interconnection extending in said first lower-level interconnection groove, wherein a top surface of said first lower level interconnection is leveled to a top surface of said lower level inter-layer insulator structure and also leveled to said top of said first lower level contact plug to form a lower-level planarized surface;

forming a higher-level inter-layer insulator structure over said lower-level planarized surface;

forming both first and second higher-level contact holes penetrating said higher-level inter-layer insulator structure, wherein said first higher-level contact hole is positioned over and aligned to said first lower-level contact plug, whilst said second higher-level contact hole is positioned over a part of said top surface of said first lower-level interconnection;

forming a higher level conductive layered structure which completely fills said first and second higher-level contact holes and which also extends over a top surface of said higher-level inter-layer insulator structure; and selectively removing said higher level conductive layered structure so that said top surface of said higher-level inter-layer insulator structure is shown and also said higher level conductive layered structure remains only within said first and second higher-level contact holes, whereby a first higher-level contact plug is formed in said first higher-level contact hole and is in contact directly with said top of said first lower-level contact plug, wherein a second higher-level contact plug is formed in said second higher-level contact hole and is in contact directly with said part of said top surface of said first lower-level interconnection, and wherein a top of said higher-level contact plug is leveled to a top surface of said higher level inter-layer insulator structure and also leveled to a top of said second higher-level contact plug to form a higher-level planarized surface.

22. The method as claimed in claim 21, wherein said lower level conductive layered structure is selectively removed by a chemical mechanical polishing method.

23. The method as claimed in claim 22, wherein said lower-level inter-layer insulator structure is formed by the steps of:

forming a lower level inter-layer insulator on said semiconductor substrate; and forming a stopper insulating film on said lower level inter-layer insulator, so that said stopper insulating film serves as a polishing stopper in said chemical mechanical polishing method.

24. The method as claimed in claim 21, wherein said first and second lower-level contact holes are formed in a first lithography process before said first lower-level interconnection groove is formed in a second lithography process.

25. The method as claimed in claim 21, wherein said first lower-level inter connection groove is formed in a first lithography process before said first and second lower-level contact holes are formed in a second lithography process.

26. The method as claimed in claim 21, wherein said higher level conductive layered structure is selectively removed by an etch-back method.

27. The method as claimed in claim 21, further comprising the steps of:

forming first and second higher-level interconnections over said higher-level planarized surface, so that said first higher-level interconnection is connected with said first higher-level contact plug, and said second higher-level interconnection is connected with said second higher-level contact plug.

* * * * *